(12) United States Patent
Mulfinger et al.

(10) Patent No.: US 11,217,678 B2
(45) Date of Patent: Jan. 4, 2022

(54) DIFFERENTIAL SG/EG SPACER INTEGRATION WITH EQUIVALENT NFET/PFET SPACER WIDTHS AND DUAL RAISED SOURCE DRAIN EXPITAXIAL SILICON AND TRIPLE-NITRIDE SPACER INTEGRATION ENABLING HIGH-VOLTAGE EG DEVICE ON FDSOI

(71) Applicant: GLOBALFOUNDRIES U.S. INC., Santa Clara, CA (US)

(72) Inventors: George Robert Mulfinger, Wilton, NY (US); Ryan Sporer, Mechanicsville, NY (US); Rick J. Carter, Saratoga Springs, NY (US); Peter Baars, Dresden (DE); Hans-Jürgen Thees, Dresden (DE); Jan Höntschel, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 16/680,196

(22) Filed: Nov. 11, 2019

(65) Prior Publication Data
US 2020/0083346 A1  Mar. 12, 2020

Related U.S. Application Data

(62) Division of application No. 15/711,674, filed on Sep. 21, 2017, now Pat. No. 10,522,655, which is a
(Continued)

(51) Int. Cl.
*H01L 29/66* (2006.01)
*H01L 21/8238* (2006.01)
(Continued)

(52) U.S. Cl.
CPC .. *H01L 29/6656* (2013.01); *H01L 21/823807* (2013.01); *H01L 21/823814* (2013.01);
(Continued)

(58) Field of Classification Search
CPC .................................................. H01L 29/66628
See application file for complete search history.

(56) References Cited

U.S. PATENT DOCUMENTS

| 7,569,443 B2 | 8/2009 | Kavalieros et al. |
| 2006/0286729 A1 | 12/2006 | Kavalieros et al. |

(Continued)

OTHER PUBLICATIONS

Office Action for the related Taiwanese patent application No. 106103802, dated Mar. 2, 2018, 6 pages.

*Primary Examiner* — Raj R Gupta
(74) *Attorney, Agent, or Firm* — Ditthavong, Steiner & Mlotkowski

(57) ABSTRACT

A method of forming matched PFET/NFET spacers with differential widths for SG and EG structures and a method of forming differential width nitride spacers for SG NFET and SG PFET structures and PFET/NFET EG structures and respective resulting devices are provided. Embodiments include providing PFET SG and EG structures and NFET SG and EG structures; forming a first nitride layer over the substrate; forming an oxide liner; forming a second nitride layer on sidewalls of the PFET and NFET EG structures; removing horizontal portions of the first nitride layer and the oxide liner over the PFET SG and EG structures; forming RSD structures on opposite sides of each of the PFET SG and EG structures; removing horizontal portions of the first nitride layer and the oxide liner over the NFET SG and EG structures; and forming RSD structures on opposite sides of each of the NFET SG and EG structures.

20 Claims, 27 Drawing Sheets

Related U.S. Application Data division of application No. 15/151,550, filed on May 11, 2016, now Pat. No. 9,806,170.

(51) Int. Cl.
  *H01L 21/84* (2006.01)
  *H01L 27/092* (2006.01)
  *H01L 27/12* (2006.01)
  *H01L 29/78* (2006.01)
  *H01L 29/08* (2006.01)
  *H01L 21/8234* (2006.01)

(52) U.S. Cl.
  CPC ...... *H01L 21/823864* (2013.01); *H01L 21/84* (2013.01); *H01L 27/092* (2013.01); *H01L 27/1203* (2013.01); *H01L 29/6653* (2013.01); *H01L 29/66628* (2013.01); *H01L 29/7838* (2013.01); *H01L 21/823412* (2013.01); *H01L 29/0847* (2013.01)

(56) References Cited

U.S. PATENT DOCUMENTS

| | | |
|---|---|---|
| 2007/0015324 A1 | 1/2007 | Chung et al. |
| 2009/0311836 A1 | 12/2009 | Cartier et al. |
| 2012/0003759 A1 | 1/2012 | Hu et al. |
| 2012/0153398 A1* | 6/2012 | Baars ............... H01L 21/823475 257/369 |
| 2012/0211844 A1 | 8/2012 | Schloesser et al. |
| 2013/0011975 A1 | 1/2013 | Cheng et al. |
| 2013/0149865 A1 | 6/2013 | Lavoie et al. |
| 2014/0369115 A1* | 12/2014 | Kim ....................... H01L 29/518 365/182 |
| 2016/0093638 A1 | 3/2016 | Cheng et al. |
| 2016/0118499 A1* | 4/2016 | Moll ................. H01L 29/78654 257/347 |
| 2016/0247876 A1 | 8/2016 | Chung et al. |

* cited by examiner

DIFFERENTIAL SG/EG SPACER INTEGRATION WITH EQUIVALENT NFET/PFET SPACER WIDTHS AND DUAL RAISED SOURCE DRAIN EXPITAXIAL SILICON AND TRIPLE-NITRIDE SPACER INTEGRATION ENABLING HIGH-VOLTAGE EG DEVICE ON FDSOI

RELATED APPLICATION

This application is a divisional of U.S. patent application Ser. No. 15/711,674, filed Sep. 21, 2017, which is a divisional of U.S. patent application Ser. No. 15/151,550, filed May 11, 2016, now U.S. Pat. No. 9,806,170, which are incorporated herein by reference in their entirety.

TECHNICAL FIELD

The present disclosure relates to p-type field effect transistor (PFET) and n-type field effect transistor (NFET) core device (SG) and I/O device (EG) spacer integration. The present disclosure is particularly applicable to fully depleted silicon-on-insulator (FDSOI) devices and/or any technology requiring raised source/drain (RSD) epitaxy.

BACKGROUND

EG devices require thicker spacers to pass standard reliability requirements. Whereas thin spacers are desired on SG devices to maintain standard performance criteria. Typical dual RSD integration relies on additive NFET/PFET spacers to block unwanted epitaxial (epi) growth. However, the device with the thicker spacer often takes a performance hit. Specifically, a high RSD/gate capacitance degrades $F_{max}$. Known approaches involve using multiple spacer materials to force RSD epi facet; sacrificing SG performance by using thicker spacers on all devices; or adding two additional spacers, a masking layer, and epi steps to support NFET and PFET EG devices. Another known approach involves forming a nitride/oxide spacer sandwich, which is difficult to control due to the use of several oxide consuming steps, e.g., multiple epi pre-cleans.

A need therefore exists for methodology enabling balanced SG performance and EG reliability with matched NFET/PFET spacer widths, methodology enabling formation of SG NFET, SG PGET, and EG NFET and PFET devices with different spacer thicknesses on FDSOI, and the resulting devices.

SUMMARY

An aspect of the present disclosure is a process of forming matched PFET/NFET spacers with differential widths for SG and EG gate structures.

Another aspect of the present disclosure is a device including matched PFET/NFET spacers with differential widths for the SG and EG gate structures.

A further aspect of the present disclosure is a process of forming differential width nitride spacers for a NFET SG gate structure, a PFET SG structure, and PFET/NFET EG gate structures, respectively.

An additional aspect of the present disclosure is a FDSOI high-k metal gate (HKMG) device having respective nitride spacer widths for the NFET SG gate structure, PFET SG structure, and PFET/NFET EG gate structures.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing PFET SG and EG gate structures and NFET SG and EG gate structures on a substrate, the PFET and NFET structures laterally separated; forming a first conformal nitride layer over the substrate; forming an oxide liner over the substrate; forming a second conformal nitride layer on sidewalls of the PFET and NFET EG gate structures; removing horizontal portions of the first nitride layer and the oxide liner over the PFET SG and EG gate structures and substrate; forming RSD structures on opposite sides of each of the PFET SG and EG gate structures; removing horizontal portions of the first nitride layer and the oxide liner over the NFET SG and EG gate structures and substrate; and forming RSD structures on opposite sides of each of the NFET SG and EG gate structures.

Aspects of the present disclosure include forming the second conformal nitride layer on the sidewalls of the PFET and NFET EG gate structures by: forming the second conformal nitride layer over the substrate; planarizing the second conformal nitride layer down to the oxide liner; forming a photoresist layer over the PFET and NFET EG gate structures; removing the second conformal nitride layer from the PFET and NFET SG gate structures, and removing the photoresist layer. Other aspects include removing the horizontal portions of the first nitride layer and the oxide liner over the PFET SG and EG gate structures and substrate by: forming a hardmask layer over the substrate; forming a photoresist layer over the NFET SG and EG gate structures; removing the hardmask layer over the PFET SG and EG gate structures; etching the first conformal nitride layer and the oxide liner down to the substrate; and removing the photoresist layer. Further aspects include the etching forming an L-shaped first conformal nitride layer spacer on opposite sides of each of the PFET SG and EG gate structures and an L-shaped oxide liner spacer on opposite sides of the PFET EG gate structure. Additional aspects include removing the horizontal portions of the first nitride layer and the oxide liner over the NFET SG and EG gate structures and substrate by: forming a hardmask layer over the substrate; forming a photoresist layer over the PFET SG and EG gate structures; removing the hardmask layer over the NFET SG and EG gate structures; etching the first conformal nitride layer and the oxide liner down to the substrate; removing the photoresist layer; and removing the hardmask layer over the PFET SG and EG gate structures. Another aspect includes the etching forming an L-shaped first conformal nitride layer spacer on opposite sides of each of the NFET SG and EG gate structures and an L-shaped oxide liner spacer on opposite sides of the NFET EG gate structure. Other aspects include the RSD structures being formed on the opposite sides of each of the PFET and NFET SG gate structures are faceted.

Another aspect of the present disclosure is a device including: PFET SG and EG gate structures and NFET SG and EG gate structures formed on a substrate, the PFET and NFET structures laterally separated; a pair of L-shaped nitride spacers formed on the substrate and adjacent to sidewalls of each of the PFET and NFET SG and EG gate structures; an L-shaped oxide spacer formed on and adjacent to each L-shaped nitride spacer of the PFET and NFET EG gate structures; a nitride spacer formed on and adjacent to each L-shaped oxide spacer; faceted RSD structures formed on opposite sides of each of the PFET and NFET SG gate structures; and RSD structures formed on opposite sides of each of the PFET and NFET EG gate structures. Aspects of the device include each L-shaped nitride spacer and each nitride spacer being formed of silicon oxycarbonitride (SiOCN), high-temperature iRad™ nitride, or silicon borocarbonitride (SiBCN)

A further aspect of the present disclosure is a method including: providing NFET SG and EG gate structures and PFET SG and EG gate structures on a FDSOI substrate, the SG and EG structures laterally separated and each including a gate and a gate cap layer; forming a conformal first nitride layer over the NFET and PFET SG and EG gate structures and the substrate; forming an oxide liner over the NFET and PFET SG and EG gate structures and substrate; forming a second conformal nitride layer over the NFET and PFET SG and EG structures and substrate; removing horizontal portions of the second nitride layer; masking the NFET and PFET EG gate structures; removing vertical portions of the second nitride layer adjacent to the NFET and PFET SG structures and exposed oxide liner; masking NFET or PFET EG and SG gate structures; removing horizontal portions of the first nitride layer; forming RSD structures on the substrate adjacent to the PFET or NFET, respectively, SG and EG structures; forming a third nitride layer over the entire substrate; masking PFET or NFET, respectively, SG and EG gate structures; removing horizontal portions of the third nitride layer; forming RSD structures on opposite sides of the PFET or NFET, respectively, SG and EG gate structures; and removing the first, second, and third nitride layers and the gate cap layer or the first, second, and third nitride layers, the gate cap layer, and the oxide liner down to an upper surface of the gate.

Aspects of the present disclosure include masking the NFET and PFET SG structures after forming the oxide liner; removing the oxide liner from the NFET and PFET EG gate structures; and removing the masking. Other aspects include removing the horizontal portions of the second nitride layer by: etching the second nitride layer down to the oxide liner. Further aspects include removing the masking of the NFET and PFET EG gate structures prior to masking the NFET and PFET SG and EG gate structures. Additional aspects include removing the masking of the NFET and PFET SG and EG gate structures prior to forming the RSD structures adjacent to the PFET or NFET SG and EG structures. Another aspect includes removing the masking of the PFET or NFET SG and EG gate structures prior to the removing of the first, second, and third nitride layers and the gate cap layer or the first, second, and third nitride layers, the gate cap layer, and the oxide liner down to an upper surface of the gate. Other aspects include removing the third nitride layer from over the RSD structures on the opposite sides of the NFET or PFET EG and SG gate structures; and performing spacer nitride deposition, etch, and silicidation subsequent to the removing of the first, second, and third nitride layers and the gate cap layer or the first, second, and third nitride layers, the gate cap layer, and the oxide liner down to an upper surface of the gate.

Another aspect of the present disclosure is a device including: a FDSOI substrate; PFET SG and EG gate structures and NFET SG and EG gate structures formed on the FDSOI substrate, the SG and EG structures laterally separated; a dual nitride layer spacer formed on each sidewall of the NFET and PFET SG gate structures; a triple nitride layer spacer formed on each sidewall of the NFET and PFET EG gate structures; and RSD structures formed on opposite sides of the NFET and PFET SG and EG gate structures. Aspects of the device include the dual nitride layer spacer being thinner than the triple nitride layer spacer. Other aspects include the PFET SG gate structure being formed over a layer of silicon germanium (SiGe) and the PFET EG and NFET SG and EG structures being formed over a layer of silicon. Further aspects include a layer of oxide being formed between a first and a second layer of nitride of the NFET and PFET EG structures.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1:
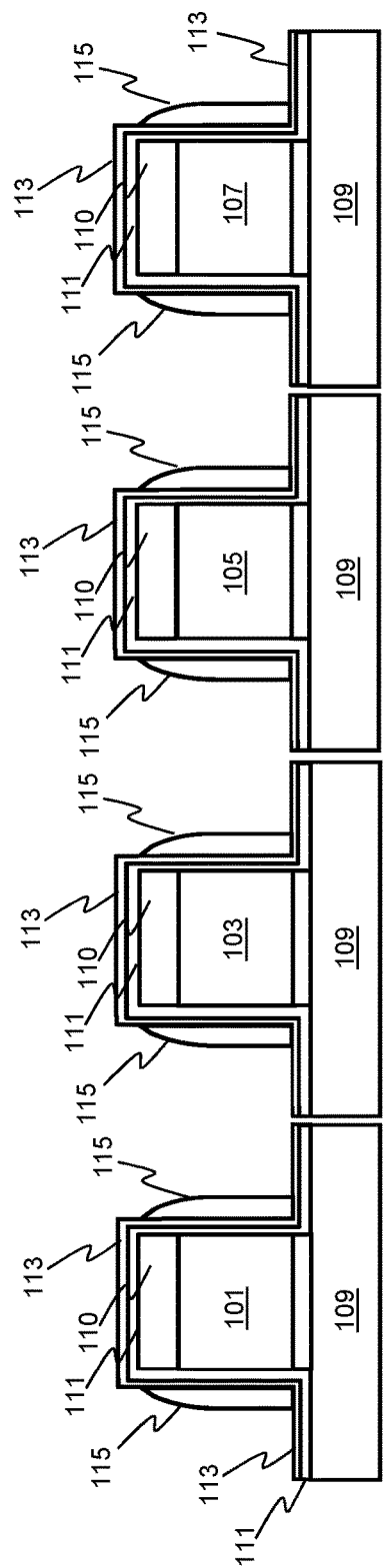
FIGS. 1 through 8 schematically illustrate a process flow for forming matched PFET/NFET spacers with differential widths for the SG and EG gate structures, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of unbalanced PFET and NFET SG and EG gate structures in terms of performance and reliability and spacer breakdown from high drain voltages attendant upon integrated RSD formation. The present disclosure also addresses and solves the current problem of a difficulty controlling nitride/oxide spacer formation attendant upon FDSOI HKMG formation.

Methodology in accordance with embodiments of the present disclosure includes providing PFET SG and EG gate structures and NFET SG and EG gate structures on a substrate, the PFET and NFET structures laterally separated. A first conformal nitride layer and an oxide liner are formed over the substrate and a second conformal nitride layer is formed on sidewalls of the PFET and NFET EG gate structures. Horizontal portions of the first nitride layer and the oxide liner are removed from over the PFET SG and EG gate structures and substrate and RSD structures are formed on opposite sides of each of the PFET SG and EG gate structures. Horizontal portions of the first nitride layer and the oxide liner are removed from over the NFET SG and EG gate structures and substrate and RSD structures are formed on opposite sides of each of the NFET SG and EG gate structures.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1 through 8 (cross-sectional views) schematically illustrate a process flow for forming matched PFET/NFET spacers with differential widths for the SG and EG gate structures, in accordance with an exemplary embodiment. Adverting to FIG. 1, a PFET SG gate structure 101, a PFET EG gate structure 103, a NFET SG gate structure 105, and a NFET EG gate structure 107 are formed on a substrate 109. Each gate structure includes a nitride gate cap 110. A nitride layer 111 is conformally formed over the substrate 109. The nitride layer 111 may be formed, for example, of low-K SiOCN, high temperature (630° C.) iRad™ nitride, or low-K SiBCN to a thickness of 4 nm to 8 nm. The nitride layer 111 needs to be thick enough to prevent epitaxial silicon growth in the RSD regions, but thin enough to optimize overlap of the source/drain regions. An oxide liner 113, e.g., formed of undoped oxide (UDOX), iRad™ oxide, or ozone tetraethyl orthosilicate (TEOS), is also formed over the substrate 109. The oxide liner 113 may be formed, for example, to a thickness of 3 nm to 6 nm. The oxide liner 113 needs to be able to withstand both the subsequently formed nitride layer removal and sacrificial hard mask etch.

Figure 2:
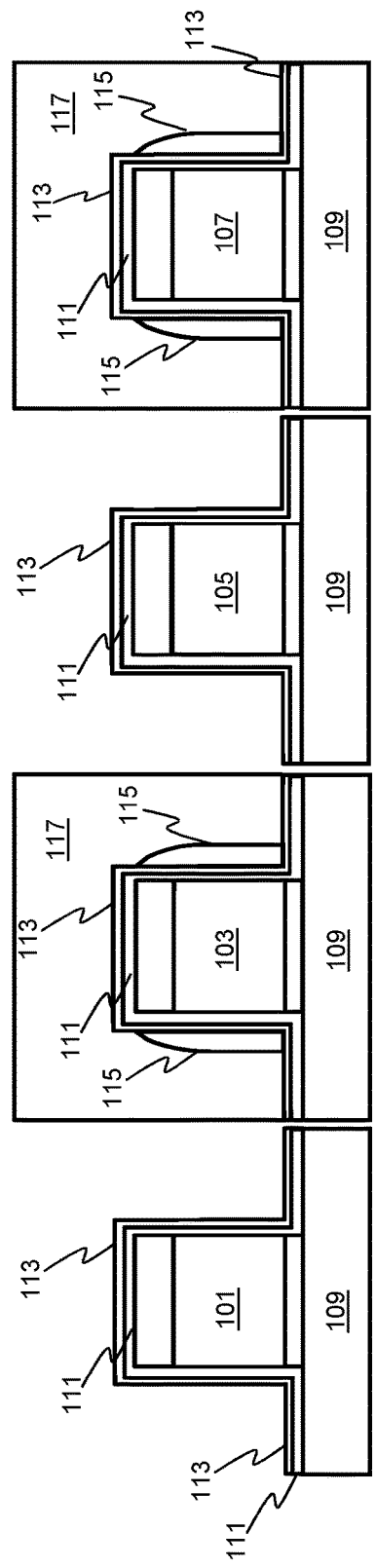

Next, a nitride layer 115 is conformally formed over the substrate 109. The nitride layer 115 is formed of the same material as the nitride layer 111 and may be formed, e.g., to a thickness of 3 nm to 15 nm depending on the technology (i.e., poly pitch or fin pitch), reliability constraints, and operating drain voltage. The nitride layer 115 must be selective to the sacrificial hardmask that follows in the process. The nitride layer 115 is then etched, e.g., by reactive ion etching (RIE) using tetrafluoromethane ($CF_4$), down to the oxide liner 113 forming outer spacers. A photoresist layer 117 is then formed over the PFET and NFET EG gate structures 103 and 107, respectively, and the nitride layer 115 is removed from the PFET and NFET SG gate structures 101 and 105, respectively, by an etchant that is isotropic and selective to the oxide liner 113, as depicted in FIG. 2. The photoresist layer 117 is then removed.

Figure 3:
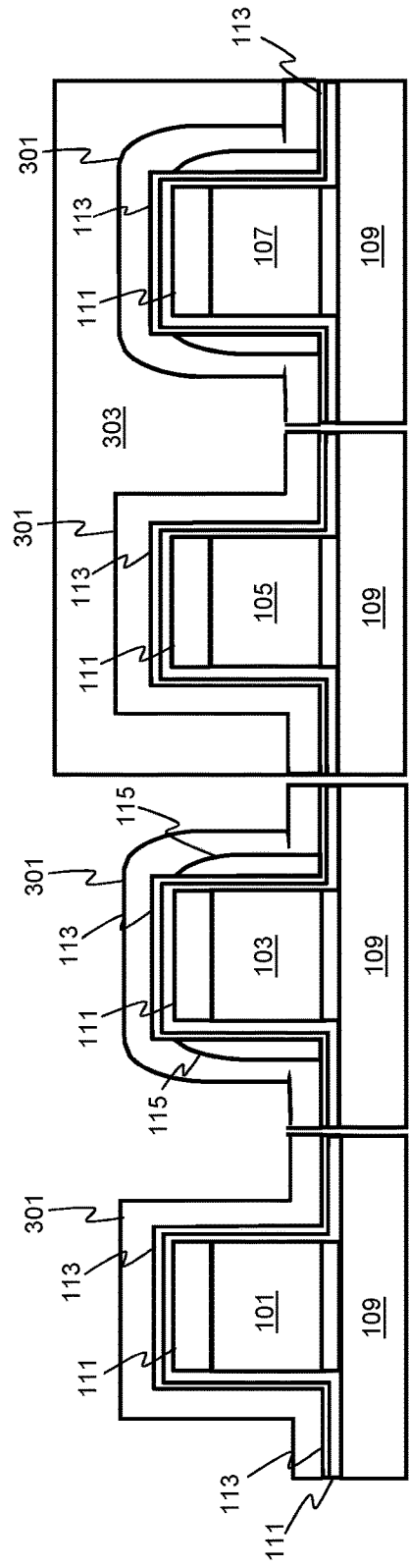

Adverting to FIG. 3, a sacrificial hardmask 301 is formed over the substrate 109. The hardmask is formed of a material that is selective to the nitride layer 115, e.g., 450° C.-500° C. iRad™ nitride or plasma-enhanced chemical vapor deposition (PECVD) nitride. A photoresist layer 303 is then formed over the NFET SG and EG gate structures 105 and 107, respectively. The hardmask 301 over the PFET SG and EG gate structures 101 and 103, respectively, is then removed, e.g., using hot phosphoric acid. The hardmask 301 may also be removed, for example, by RIE using fluoromethane/oxide ($CH_3F/O_2$), to isotopically etch the hardmask 301 and to stop on the oxide liner 113.

Figure 4:
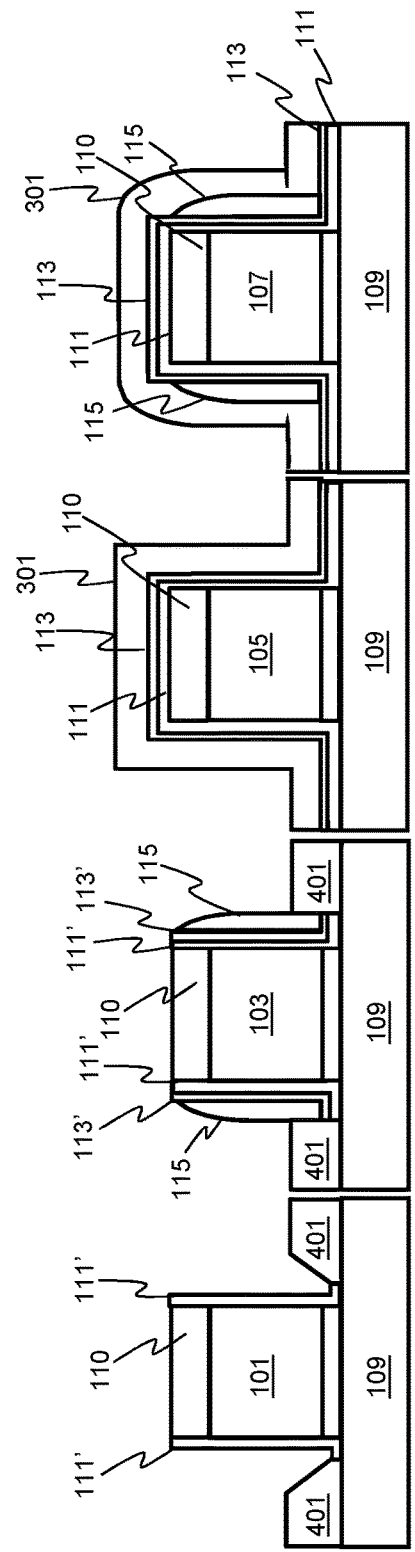

Next, the oxide liner 113 and the nitride layer 111 are anisotropically etched down to the substrate 109 and gate caps 110, e.g., by RIE using $CF_4$, forming nitride L-shaped spacers 111' and oxide L-shaped spacers 113' on opposite sides of the PFET EG gate structure 103, as depicted in FIG. 4. After the final PFET spacer etch, the photoresist layer 303 is removed. The oxide liner 113 may also be removed by a hydrofluoric (HF) pre-clean, leaving the nitride L-shaped spacers 111' on the PFET SG gate structure 101. Thereafter, the RSD structures 401 are formed by epitaxial growth while the complimentary devices are protected by the sacrificial hard mask 301. The specific length of the horizontal surface of the L-shaped spacers 111' and 113', e.g., 2 nm to 6 nm, will depend on a combination of factors such as the epitaxial precursor gas, hydrochloric acid (HCL) flow, spacer material, and spacer shape. Optionally, after the RSD structures 401 are grown, a thin oxide liner (not shown for illustrative convenience) may be formed, e.g., by plasma oxidation or by a deposited oxide, to protect the RSD structures 401 during further processing steps. If the thin oxide liner is deposited, it should be as thin as possible, e.g., 2 nm to 3 nm, to prevent the final L-shaped spacer of the NFET SG gate structure 105 from becoming too wide.

Figure 5:
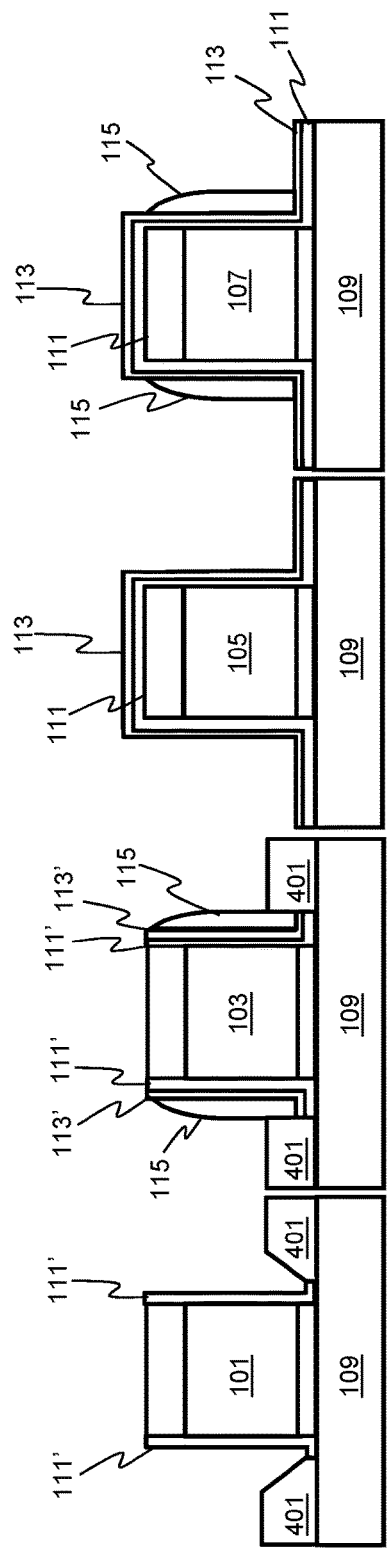
Figure 6:
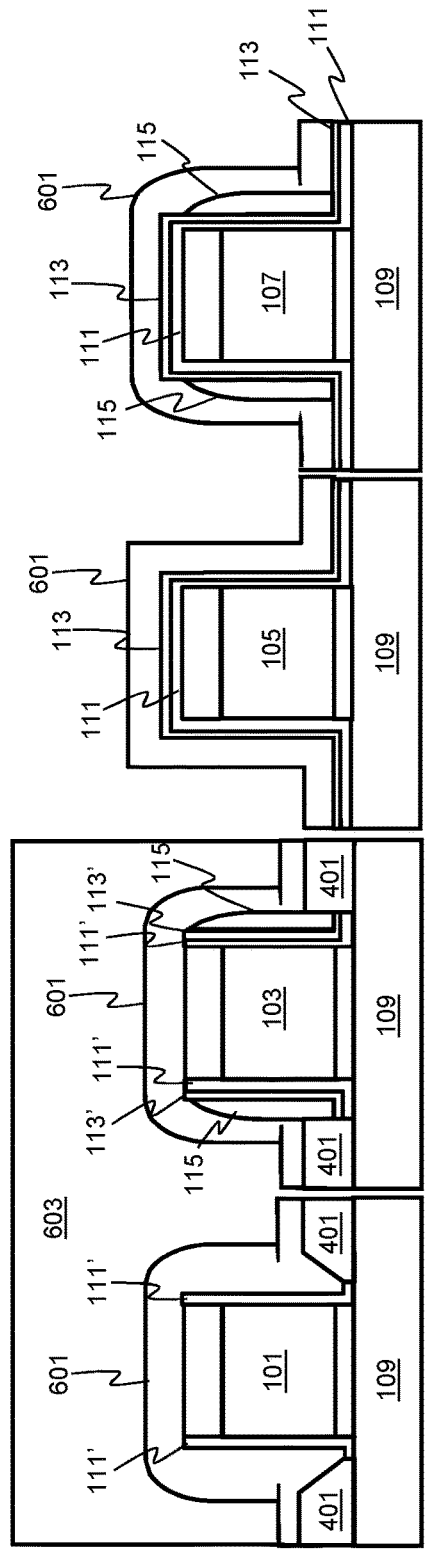
Figure 7:
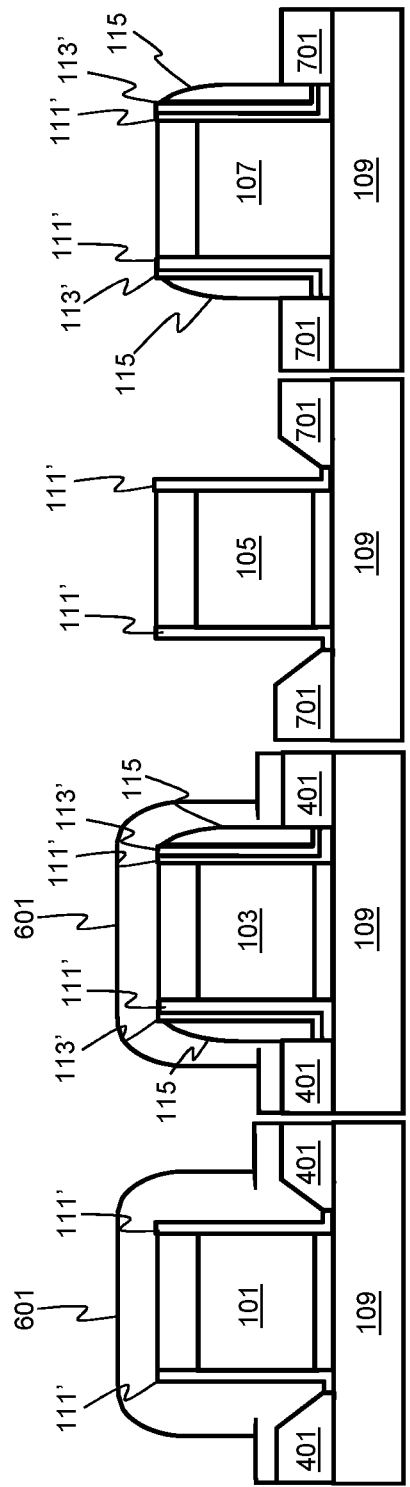

Adverting to FIG. 5, the hardmask layer 301 is isotropically removed from over the NFET SG and EG gate structures, 105 and 107, respectively. Next, similar to the steps of FIG. 3, a new hard mask layer 601 is formed over the substrate 109, as depicted in FIG. 6. Alternatively, the hardmask layer 301 may be left over the NFET SG and EG gate structures 105 and 107, respectively, before depositing the hardmask layer 601. A photoresist layer 603 is then formed over the PFET SG and EG gate structures 101 and 103, respectively, and the hardmask layer 601 (and hardmask layer 301, if still present) over the NFET SG and EG gate structures 105 and 107, respectively, is isotropically removed, e.g., using hot phosphoric acid, as depicted in FIG. 7. Similar to the hardmask layer 301, the hardmask layer 601 may also be removed, for example, by RIE using $CH_3F/O_2$.

Figure 8:
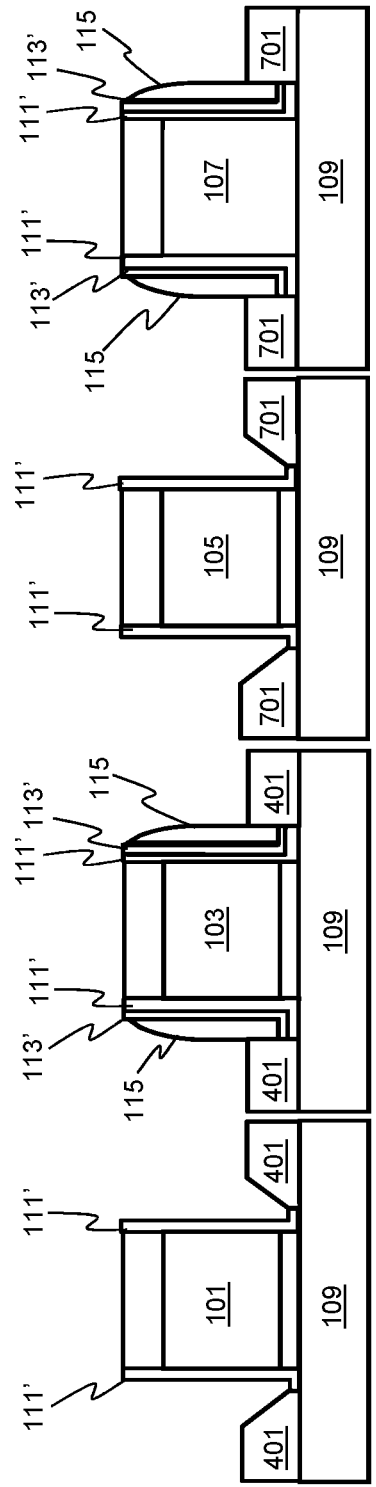

The oxide liner 113 and the nitride layer 111 are then anisotropically etched down to the substrate 109 and gate caps 110, e.g., by RIE using $CF_4$, forming nitride L-shaped spacers 111' and oxide L-shaped spacers 113' on opposite sides of the NFET SG and EG gate structures 105 and 107, respectively. After the final NFET spacer etch, the photoresist layer 603 is removed. Again, the oxide liner 113 may also be removed by a HF pre-clean forming the nitride L-shaped spacers 111' on the NFET SG gate structure 105. Next, the RSD structures 701 are formed by epitaxial growth while the complimentary devices are protected by the sacrificial hard mask 601. Optionally, after the RSD structures 701 are grown, a thin oxide liner (not shown for illustrative convenience) may again be formed, e.g., by plasma oxidation or by a deposited oxide, to protect the RSD structures 701 during the subsequent removal of the hardmask layer 601. The hardmask layer 601 over the PFET SG and EG gate structures 101 and 103, respectively, is then isotropically removed, e.g., using hot phosphoric acid or RIE using $CH_3F/O_2$, as depicted in FIG. 8. Consequently, the nitride spacers 111' and 115 have matched widths for the PFET and NFET SG and EG gate structures. Also, SG performance is balanced with EG reliability requirements.

Figure 9:
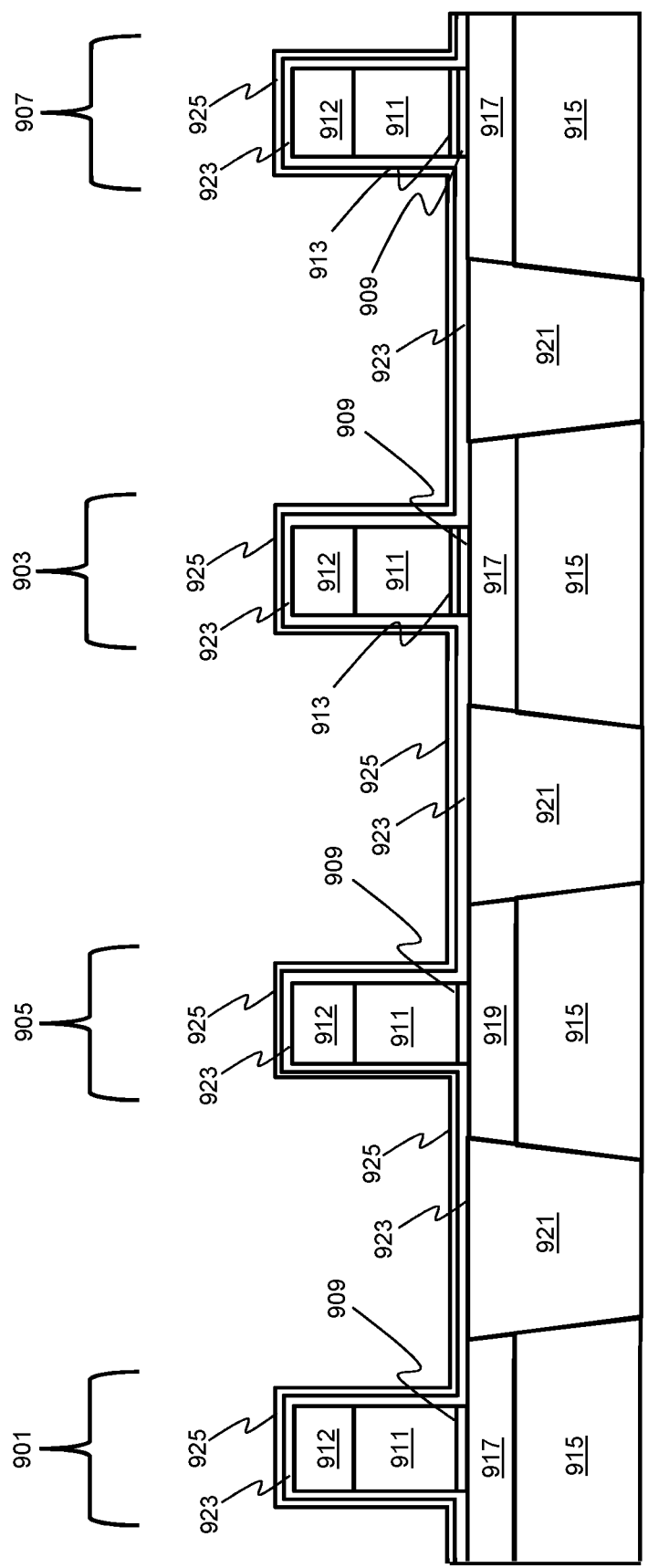
FIGS. 9 through 21 schematically illustrate a process flow for forming a FDSOI HKMG device having different nitride spacer widths for the NFET SG gate structure, PFET SG structure, and PFET/NFET EG gate structures, in accordance with an exemplary embodiment.

FIGS. 9 through 21 (cross-sectional views) schematically illustrate a process flow for forming a FDSOI HKMG device having different nitride spacer widths for the NFET SG gate structure, PFET SG structure, and PFET/NFET EG gate structures, in accordance with an exemplary embodiment. Adverting to FIG. 9, NFET SG and EG gate structures 901 and 903, respectively, and PFET SG and EG structures 905 and 907, respectively, are formed over a FDSOI substrate (not shown for illustrative convenience). Each gate structure includes a high-K metal gate 909, a silicon layer 911, and a nitride gate cap 912, and the NFET and PFET EG structures 903 and 907, respectively, also include a thick gate oxide layer 913 compared to the nonvisible gate oxide on the SG side. A buried oxide (BOX) layer 915 and a silicon channel layer 917 or a SiGe channel layer 919 are formed over the FDSOI substrate and between the BOX layer shallow trench isolation (STI) regions 921 are formed. A nitride layer 923 is then conformally formed over the substrate. The nitride layer 923 may be formed, e.g., to a thickness of 56 angstrom (Å) to 64 Å by molecular layer deposition (MLD). Thereafter, an oxide liner 925 is conformally formed, for example, to a thickness of 20 Å to 40 Å, over the nitride layer 923.

Figure 10:
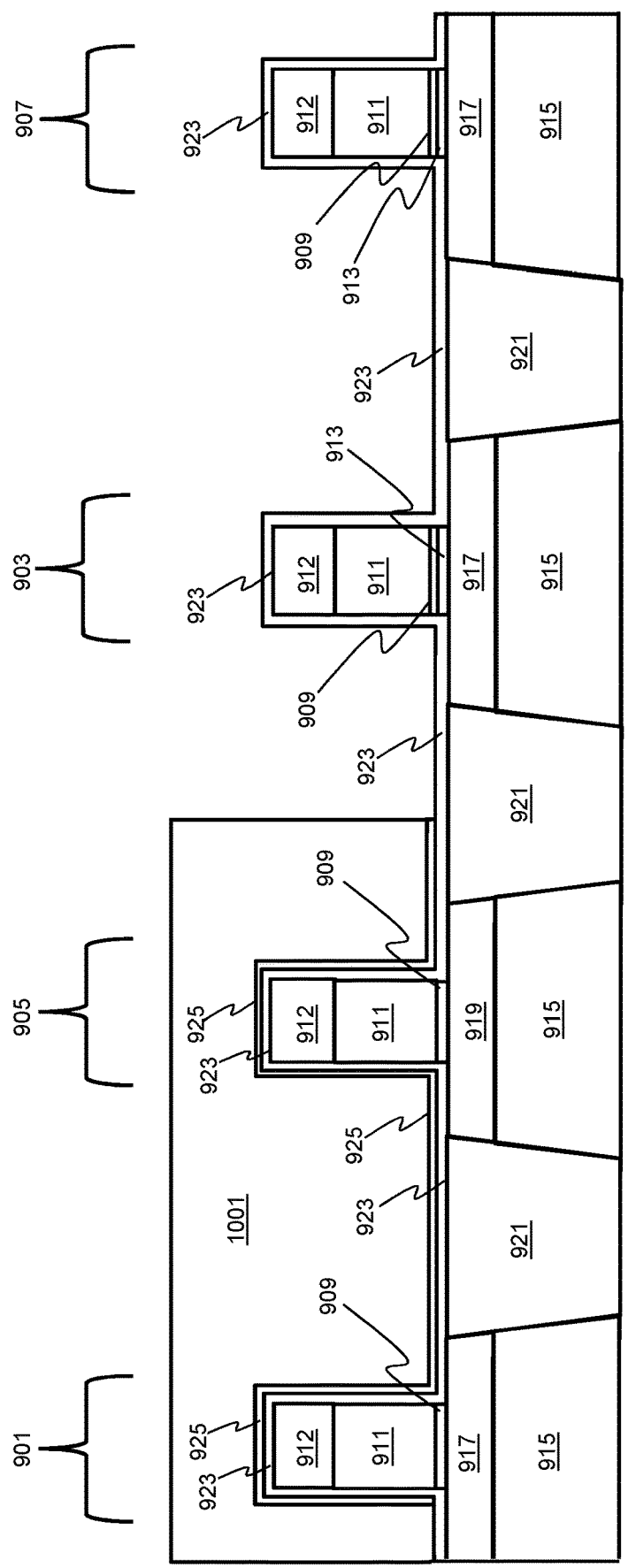
Figure 11:
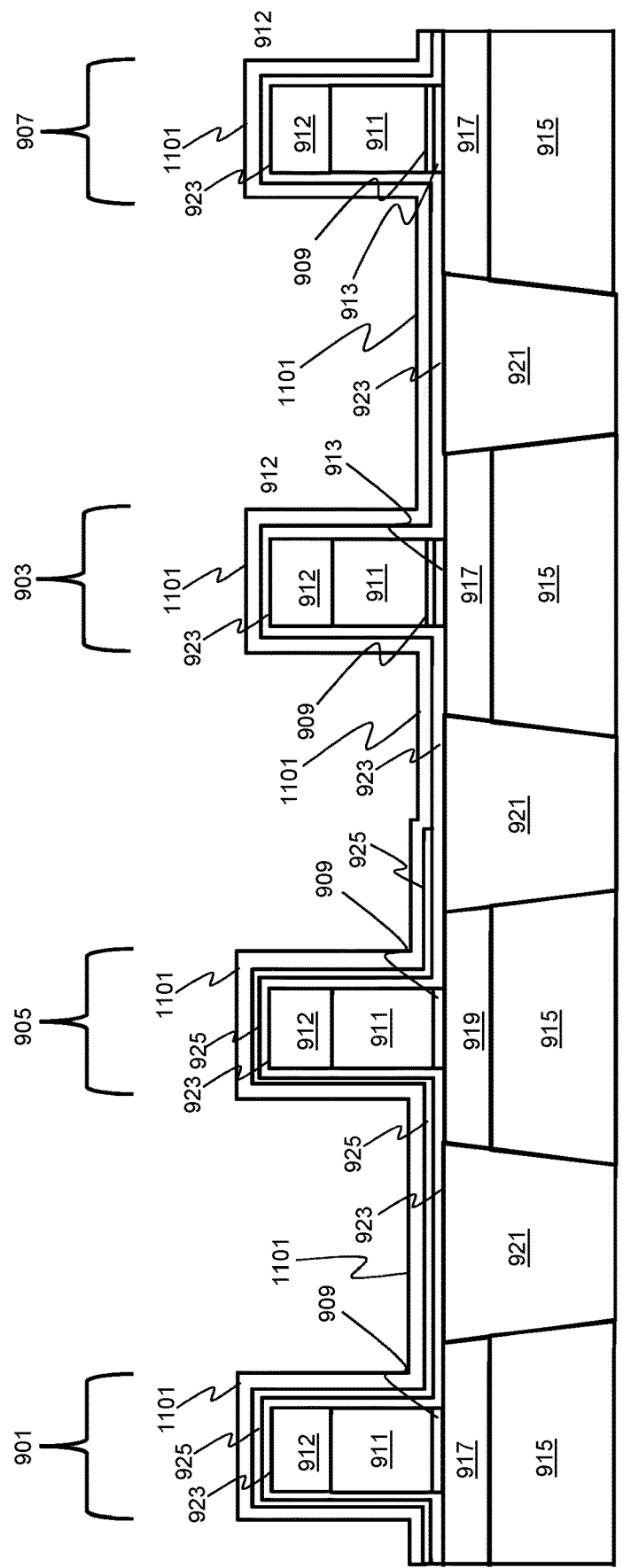
Figure 12:
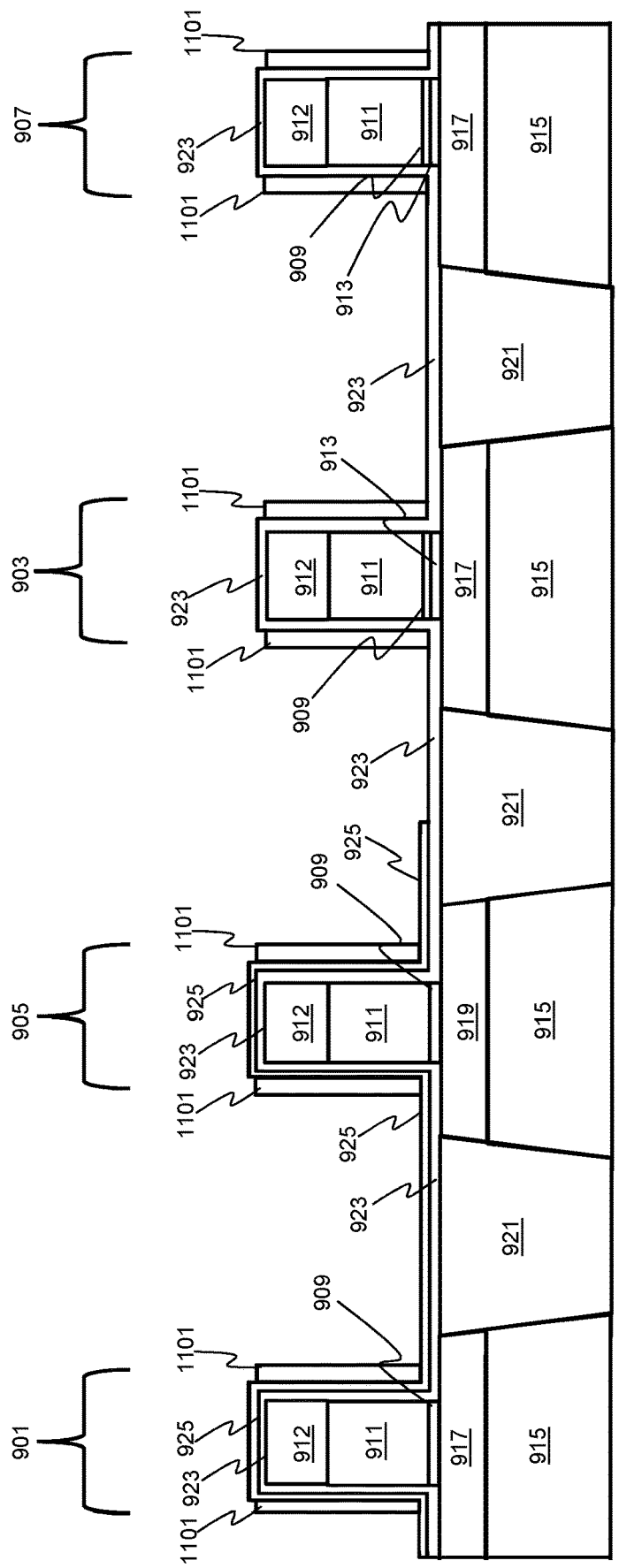

Adverting to FIG. 10, a photoresist layer 1001 is formed over the NFET and PFET SG structures 901 and 905, respectively, and the oxide liner 925 is removed from the NFET and PFET EG structures 903 and 907, respectively, and the substrate. The oxide liner 925 may be removed, for example, by a WING™ or SiCoNi™ process. Thereafter, the photoresist layer 1001 is removed. A nitride layer 1101 is then conformally formed over the substrate by MLD to a thickness of 60 Å to 80 Å, as depicted in FIG. 11 Next, horizontal portions of the nitride layer 1101 are removed, for example, by performing a spacer etch down to the remaining oxide liner 925, as depicted in FIG. 12. Approximately 40%-80% of the chip area at this point is covered with the oxide liner 925 and, therefore, it functions as a sufficient distinct etch stop signal. Consequently, there is a minimal loss of the nitride layer 923, e.g., less than 10 Å, resulting from the etching of the nitride layer 1101.

Figure 13:
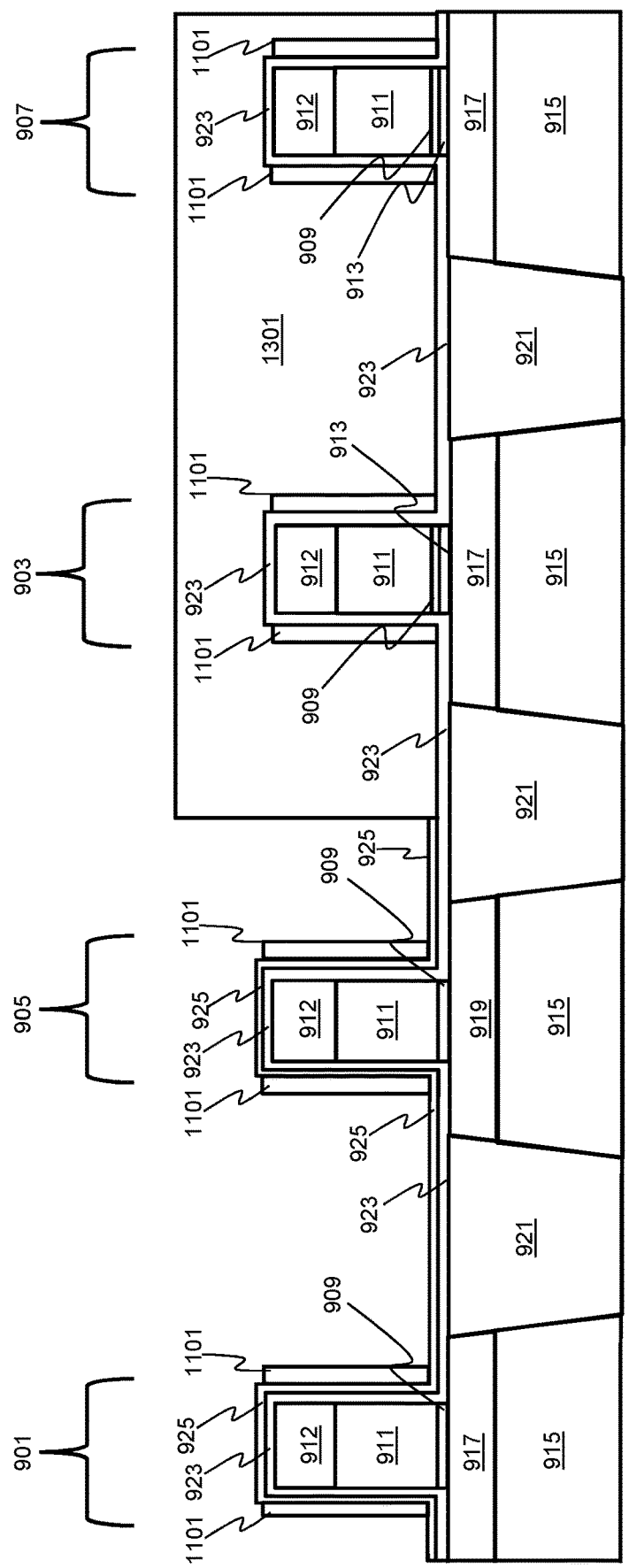
Figure 14:
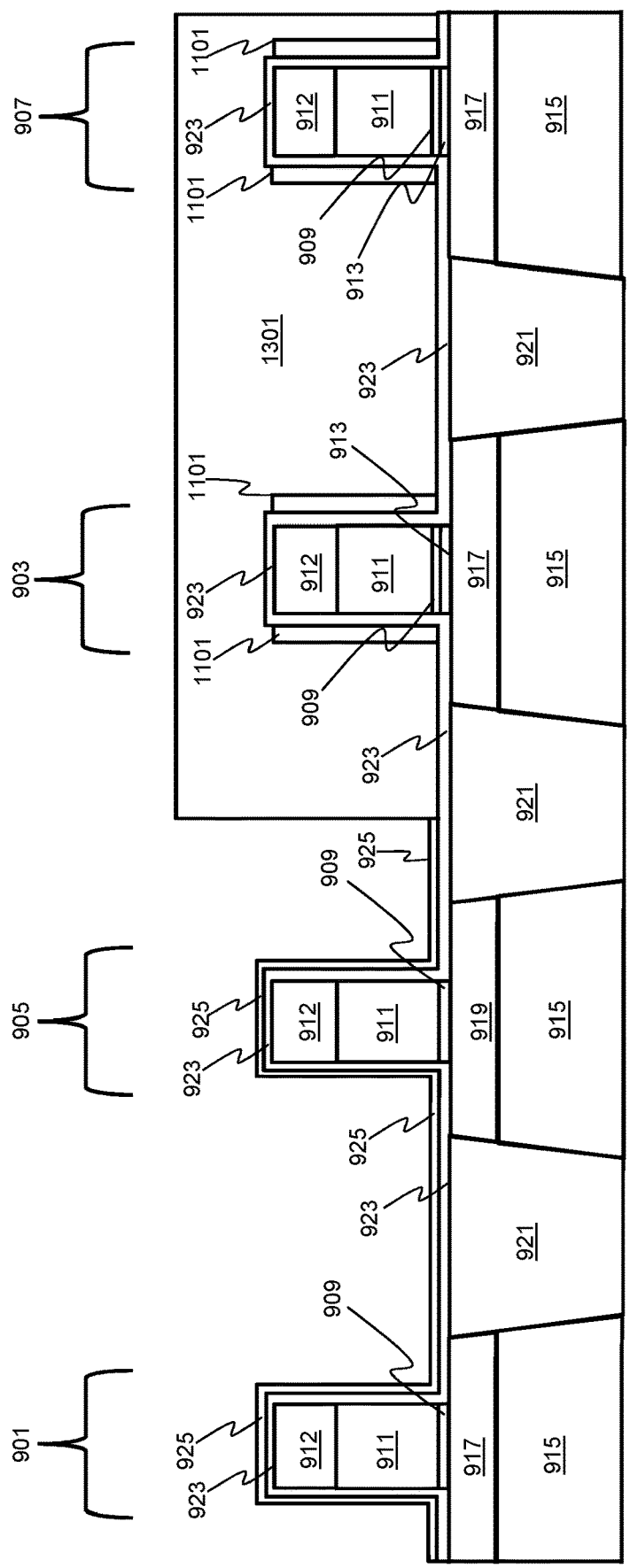
Figure 15:
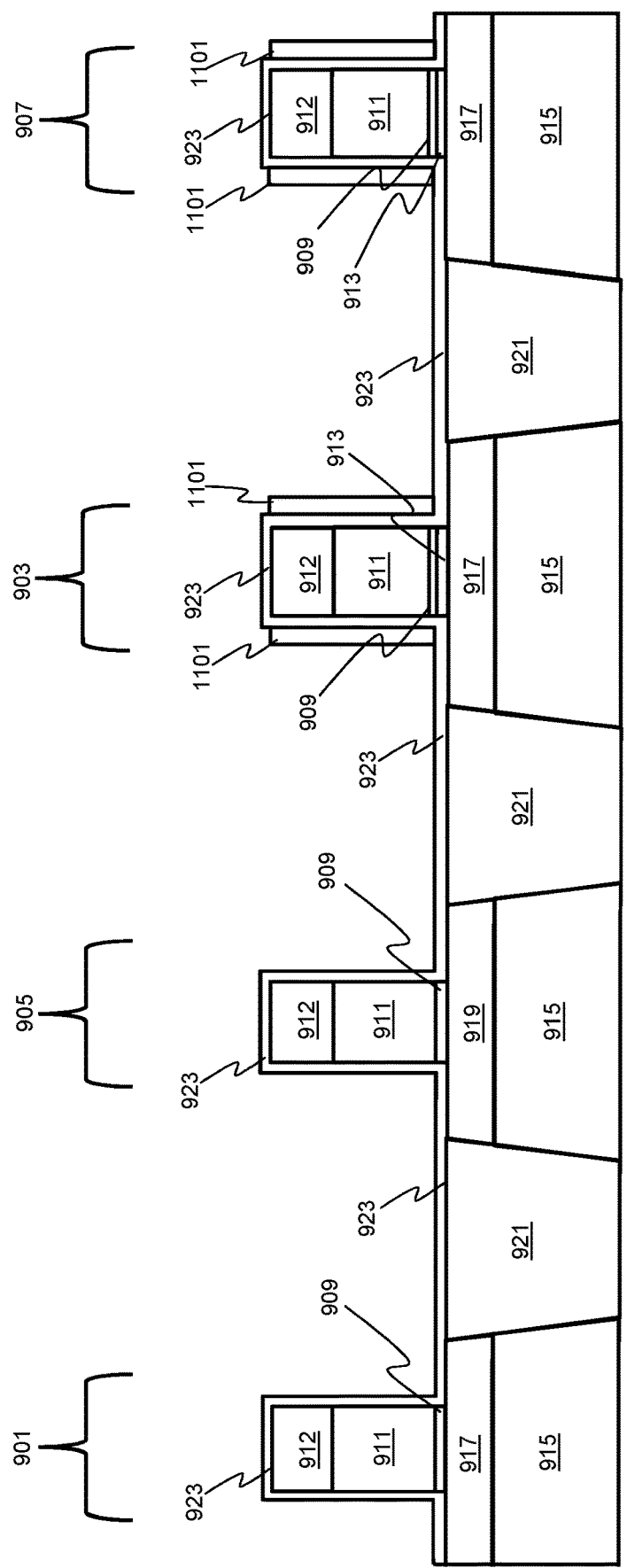

A soft cleaning is performed, and then a photoresist layer 1301 is formed over the NFET and PFET EG gate structures 903 and 907, respectively, as depicted in FIG. 13. Adverting to FIG. 14, the vertical portions of the nitride layer 1101 are removed from the NFET and PFET SG gate structures 901 and 905, respectively, by an isotropic nitride etch highly selective to oxide, e.g., difluoromethane ($CH_2F_2$) or $CH_3F$. Next, the photoresist layer 1301 is stripped, and the oxide liner 925 is removed, e.g., by wet or dry etching, as depicted in FIG. 15. The wafer surface at this step is completely protected by the nitride layer 923, and, therefore, there should be no damage to the wafer as a result of removing the oxide liner 925.

Figure 16:
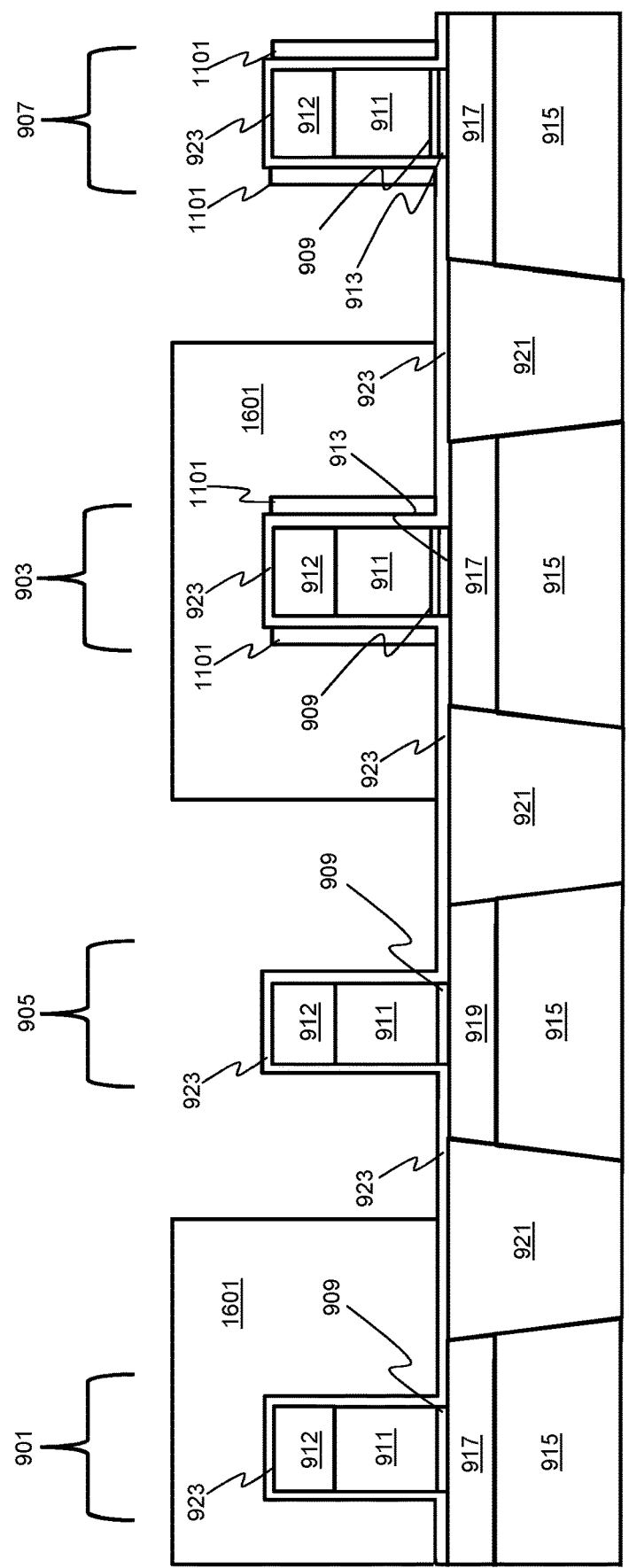
Figure 17:
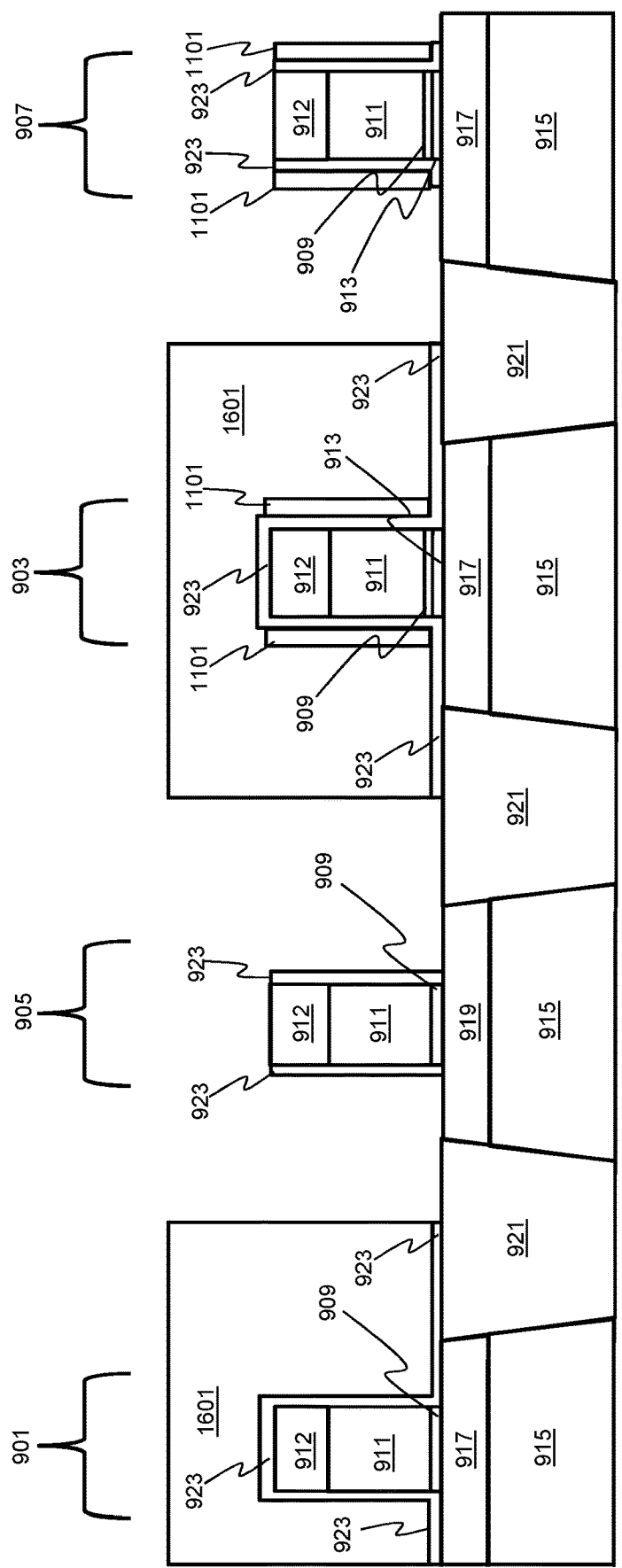

Adverting to FIG. 16, a photoresist layer 1601 is formed over the NFET SG and EG gate structures 901 and 903, respectively. Alternatively, the photoresist layer 1601 could be formed over the PFET SG and EG gate structures 905 and 907, respectively. Whether to mask the NFET or PFET gate structures first depends on the desired spacer thickness for each device, as later stage masking produces thicker spacers. Exposed horizontal portions of the nitride layer 923 are then removed, e.g., by RIE, from the PFET SG and EG structures 905 and 907, respectively, as depicted in FIG. 17. Thereafter, the photoresist layer 1601 is stripped, and an epi pre-clean process is performed, e.g., using diluted hydrofluoric acid (DHF)/SiCoNi™, which will remove some of the BOX layer 915 (not shown for illustrative convenience).

Figure 18:
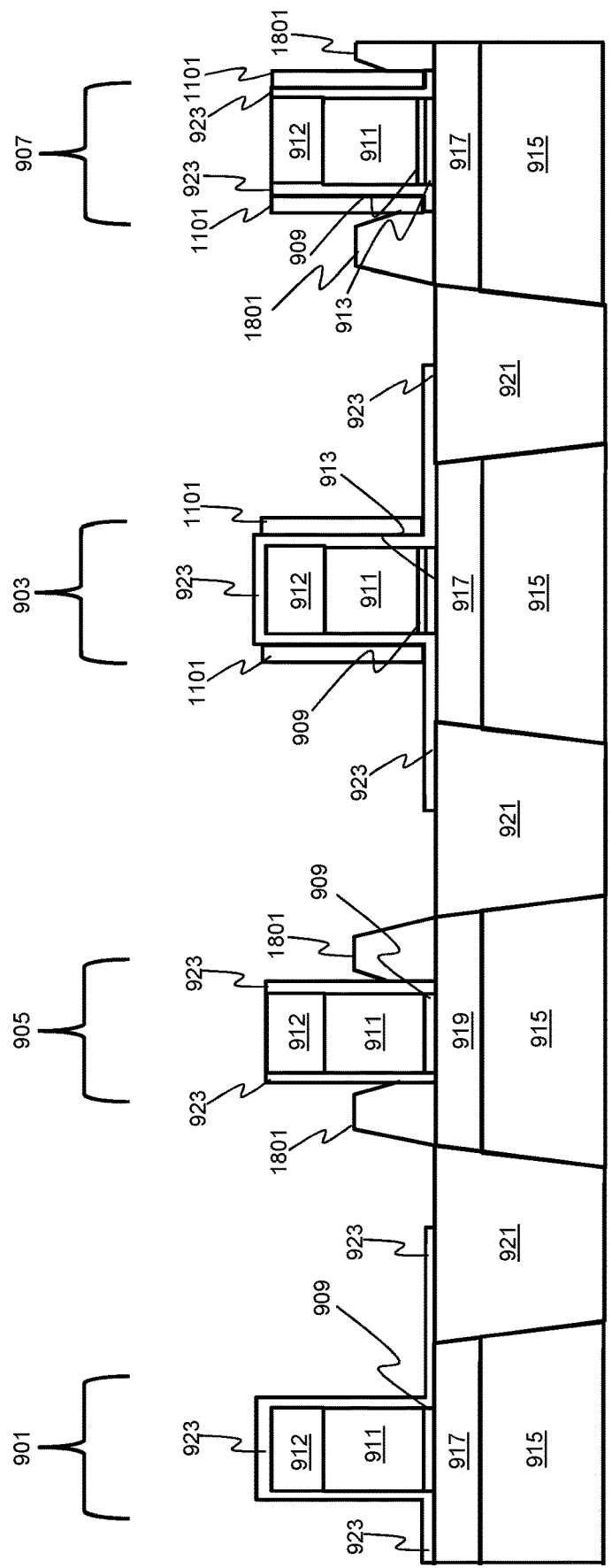
Figure 19:
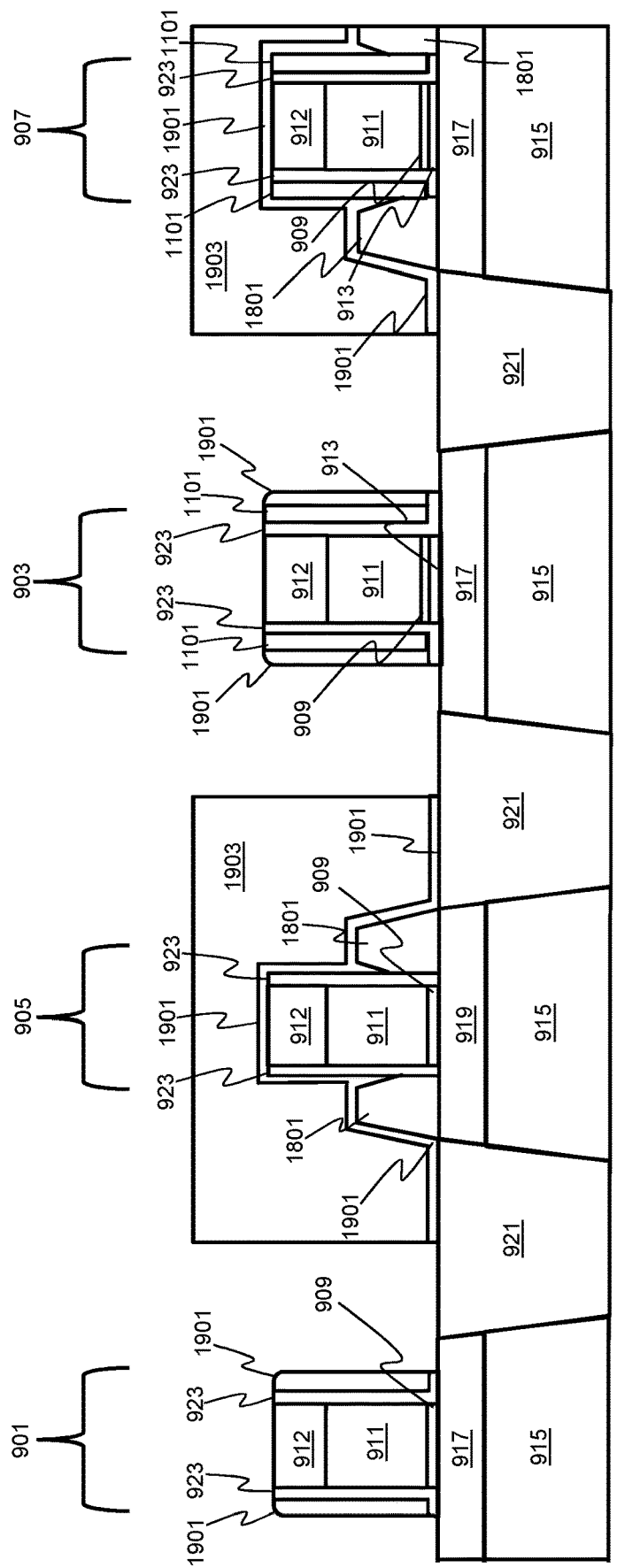

Next, the RSD structures 1801 are formed by epitaxial growth on the SiGe layer 919 and the Si layer 917 adjacent to the PFET SG and EG structures 905 and 907, respectively, or on the Si layers 917 adjacent to the NFET SG and EG structures 901 and 903, respectively, depending on which gate structures are masked first, as depicted in FIG. 18. A nitride layer 1901 is then formed over the entire substrate (not shown for illustrative convenience). Next, a photoresist layer 1903 is formed over the PFET SG and EG gate structures 905 and 907, respectively, or over the NFET SG and EG gate structures 901 and 903, respectively, depending on which gate structures are masked first. Horizontal portions of the nitride layers 1901 and 923 are then removed, e.g., by RIE, from the NFET SG and EG gate structures 901 and 903, respectively.

Figure 20:
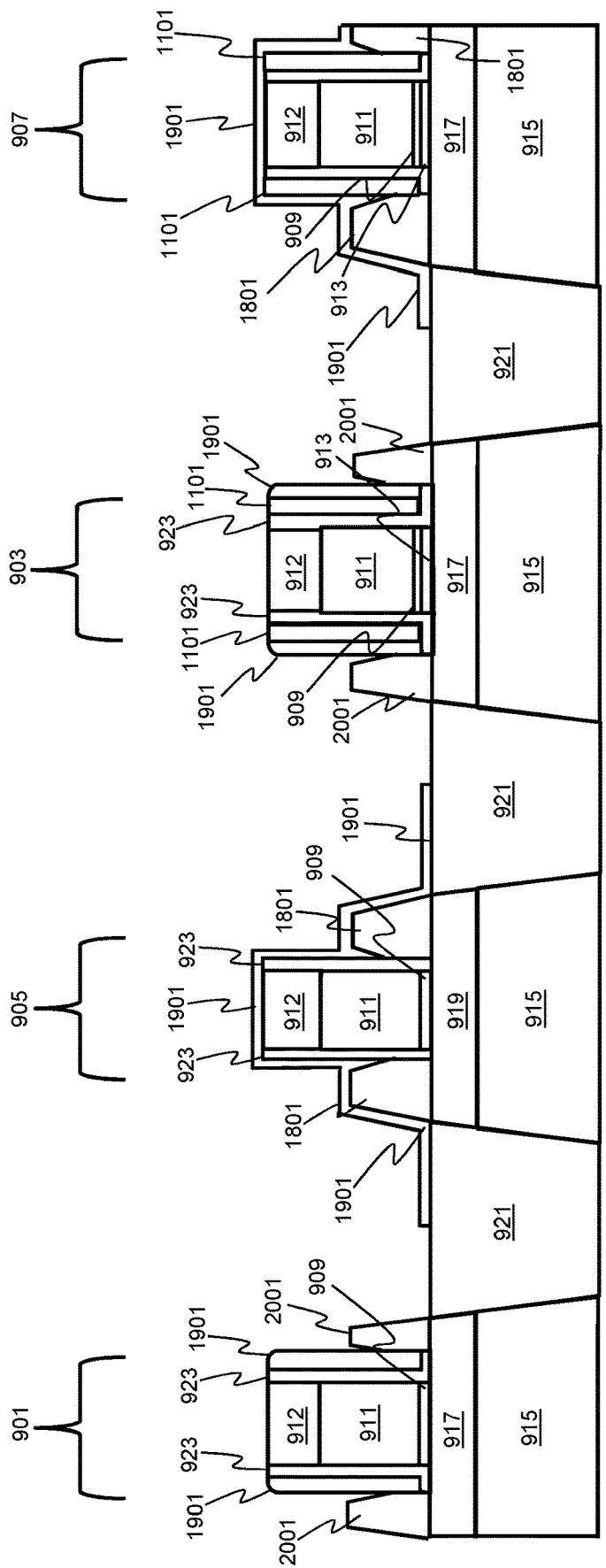
Figure 21:
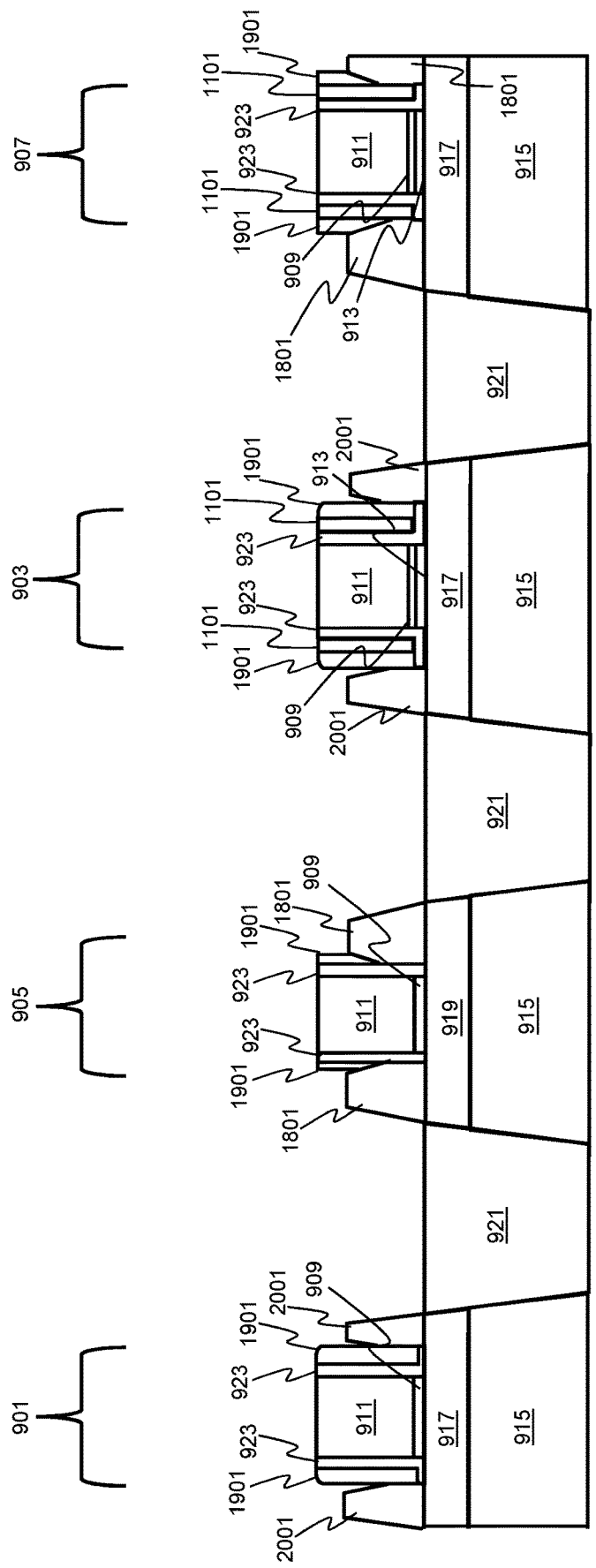
Figure 22:
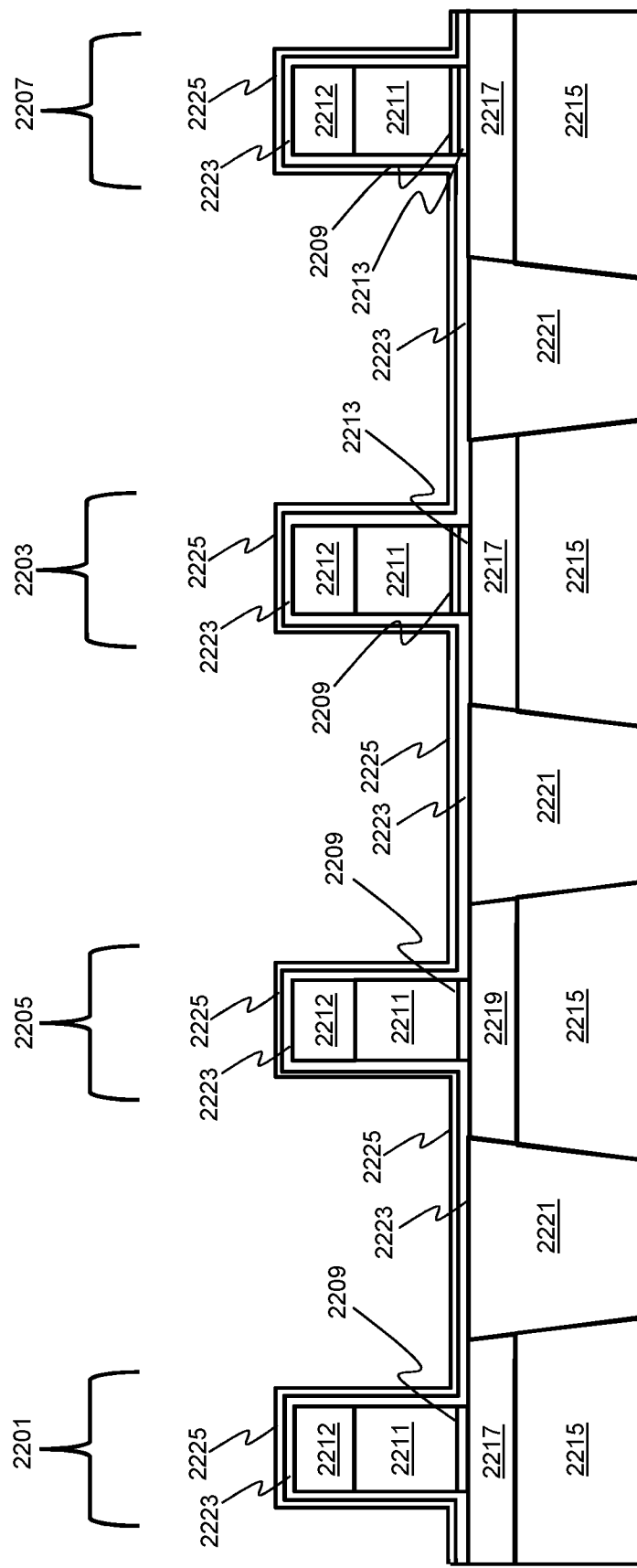
FIGS. 22 through 31 schematically illustrate another process flow for forming a FDSOI HKMG device having different nitride and/or nitride/oxide spacer widths for the NFET SG gate structure, PFET SG structure, and PFET/NFET EG gate structures, in accordance with an exemplary embodiment.

Adverting to FIG. 20, similar to FIG. 17, the photoresist layer 1903 is stripped, and an epi pre-clean process is performed, e.g., using DHF/SiCoNi™, again removing some of the BOX layer 915 (not shown for illustrative convenience). The RSD structures 2001 are then formed by epitaxial growth on the Si layers 917 adjacent to the NFET SG and EG structures 901 and 903, respectively, or the SiGe layer 919 and the Si layer 917 adjacent to the PFET SG and EG structures 905 and 907, respectively, depending on which gate structures are masked first. Next, the gate caps 912 are removed, and nitride layers 923, 1101, and 1901 are etched, e.g., by RIE or by an appropriate wet etch using hot phosphoric acid, down to the upper surface of the silicon layer 911, as depicted in FIG. 21. The nitride layer 1901 is then removed from the RSD structures 1801 or 2001, wherever it remains. The removal of the nitride layers 923, 1101, and 1901 may also be performed with an optional organic planarization layer (OPL) plus etch back protection. Thereafter, a spacer nitride deposition, etch, and silicidation is performed (not shown for illustrative convenience).

FIGS. 22 through 31 (cross-sectional views) schematically illustrate another process flow for forming a FDSOI HKMG device having different nitride and/or nitride/oxide spacer widths for the NFET SG gate structure, PFET SG structure, and PFET/NFET EG gate structures, in accordance with an exemplary embodiment. Adverting to FIG. 22, similar to FIG. 9, NFET SG and EG gate structures 2201 and 2203, respectively, and PFET SG and EG structures 2205 and 2207, respectively, are formed over a FDSOI substrate (not shown for illustrative convenience). Each gate structure includes a high-K metal gate 2209, a silicon layer 2211, and a gate cap 2212, and the NFET and PFET EG structures 2203 and 2207, respectively, also include a thick gate oxide layer 2213 compared to the nonvisible gate oxide on the SG side. A BOX layer 2215 and a Si channel layer 2217 or a SiGe channel layer 2219 are formed over the FDSOI substrate and STI regions 2221 are formed between the BOX layer 2215. A nitride layer 2223 is then conformally formed over the substrate. The nitride layer 2223 may be formed, e.g., to a thickness of 56 Å to 64 Å by MLD. Thereafter, an oxide liner 2225 is conformally formed, for example, to a thickness of 20 Å to 40 Å, over the nitride layer 2223.

Figure 23:
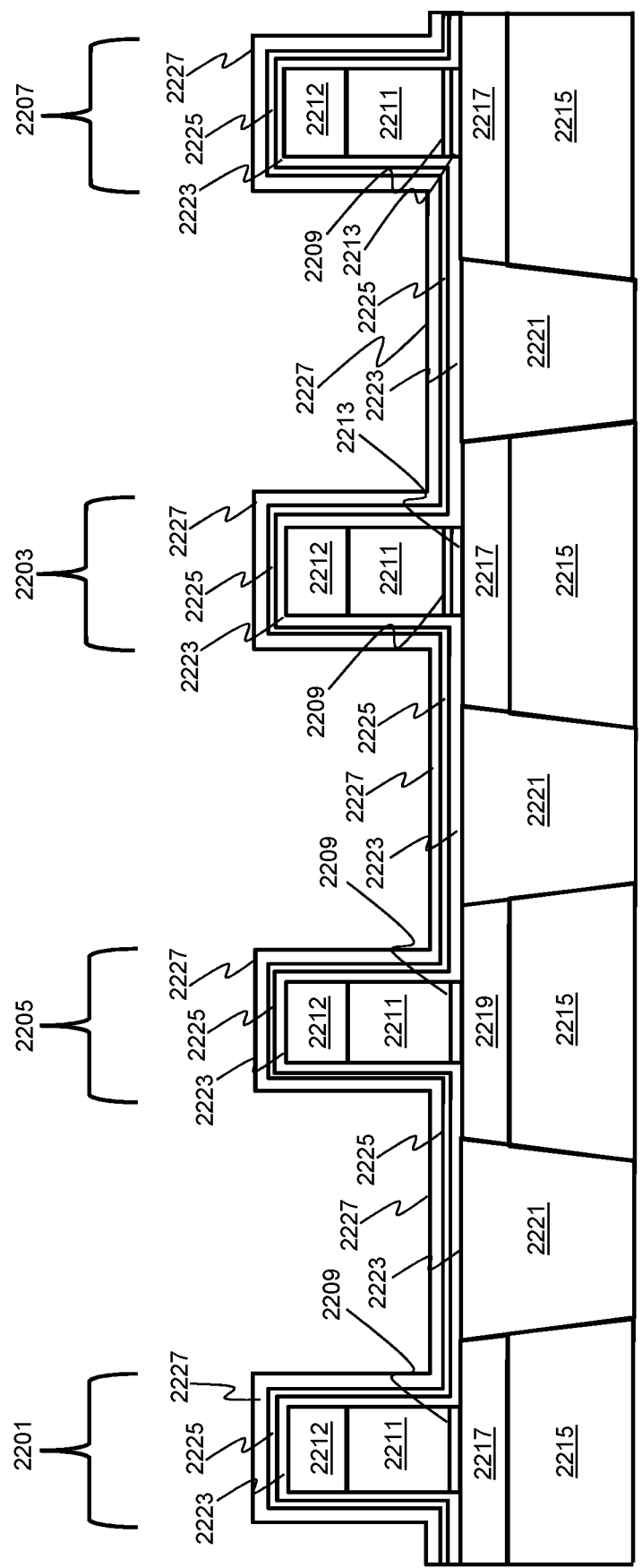
Figure 24:
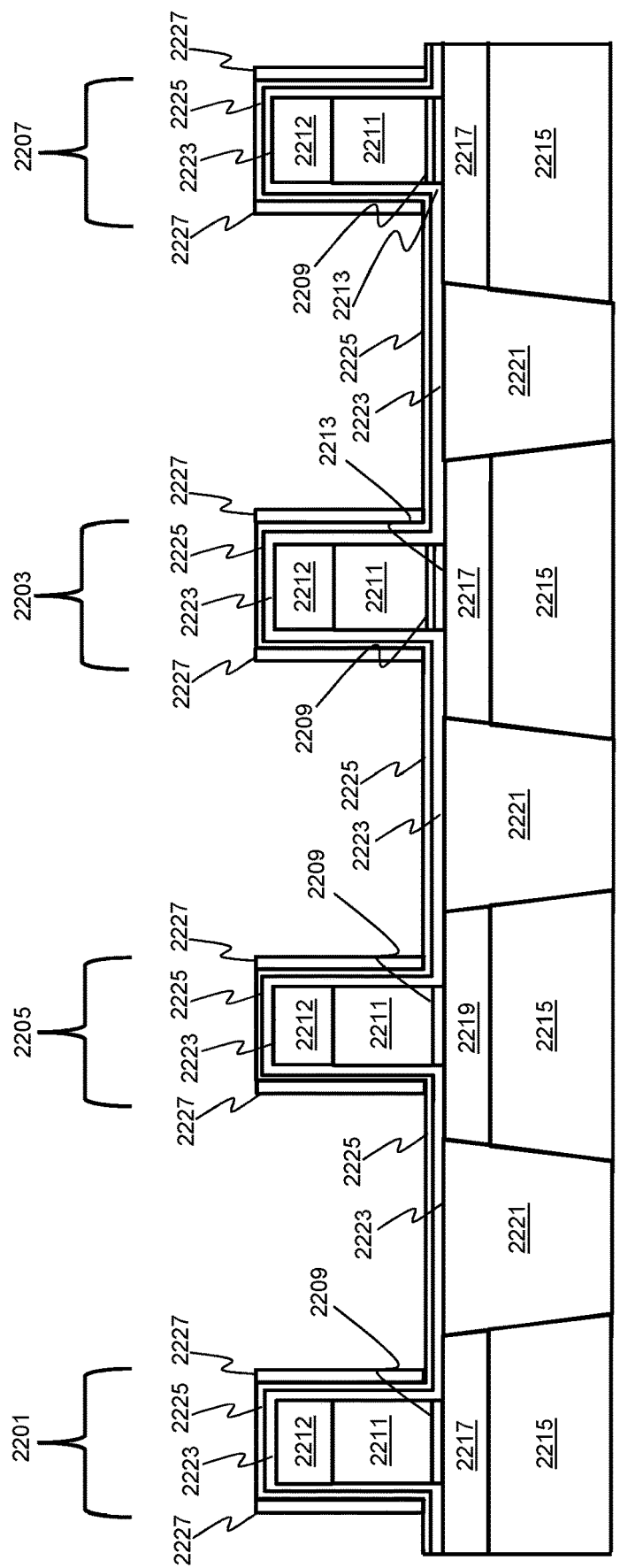

Next, a nitride layer 2227 is conformally formed to a thickness of 60 Å to 80 Å by MLD over the substrate, as depicted in FIG. 23. Horizontal portions of the nitride layer 2227 are then removed, for example, by performing a spacer etch down to the oxide liner 2225, leaving the nitride layer 2223 untouched, as depicted in FIG. 24. Thereafter, a soft cleaning is performed, e.g., using a cold SC1 solution.

Figure 25:
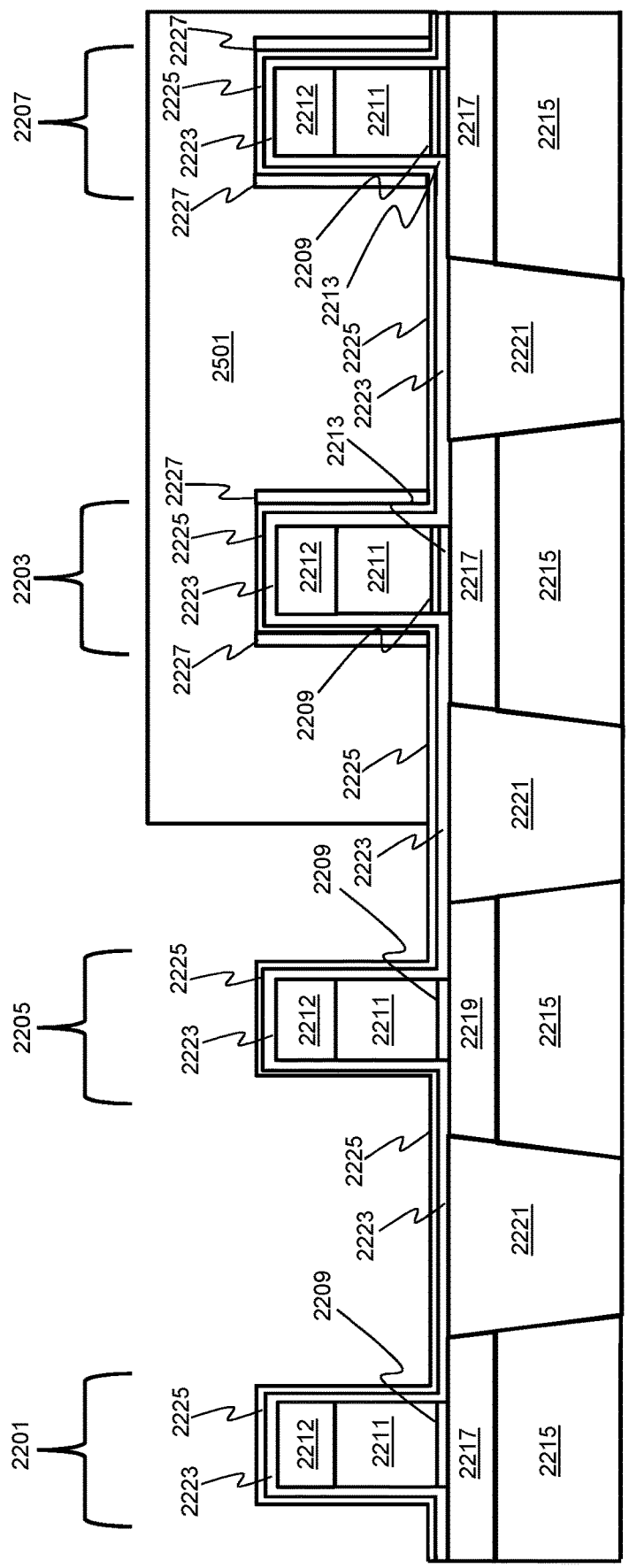
Figure 26:
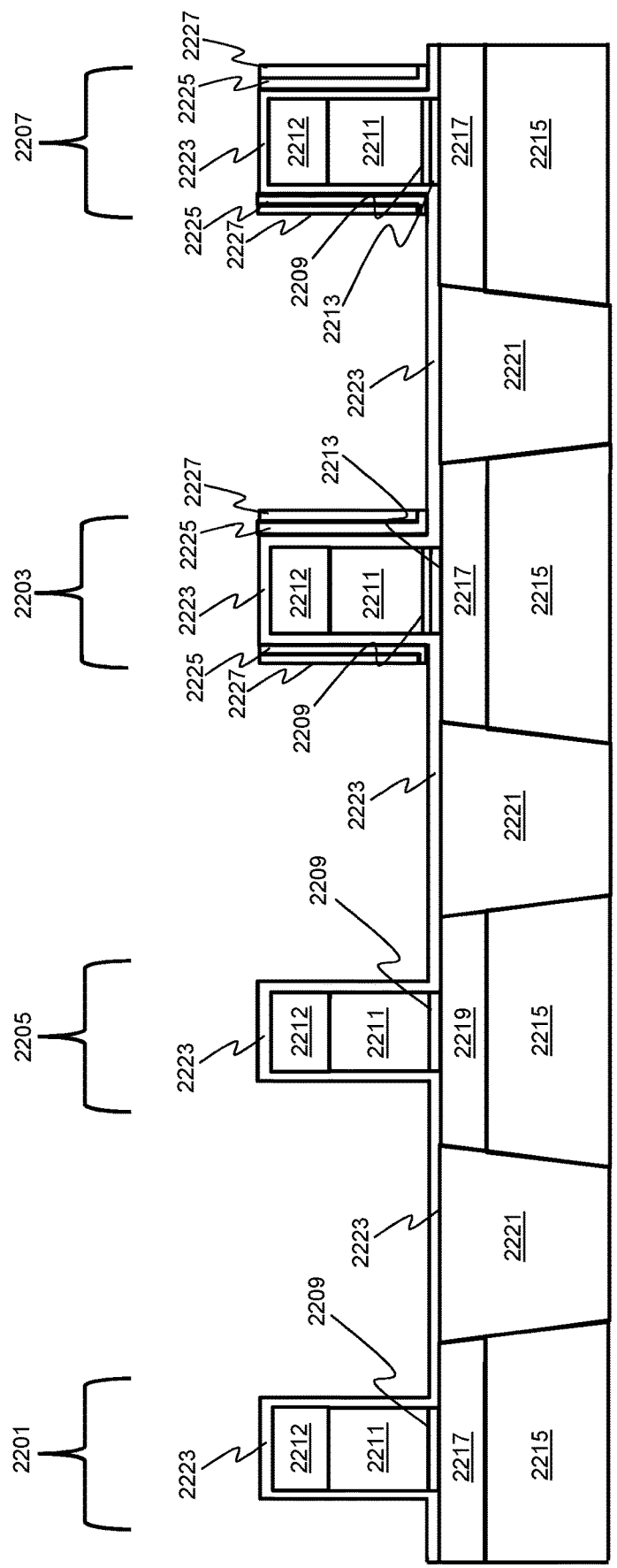
Figure 27:
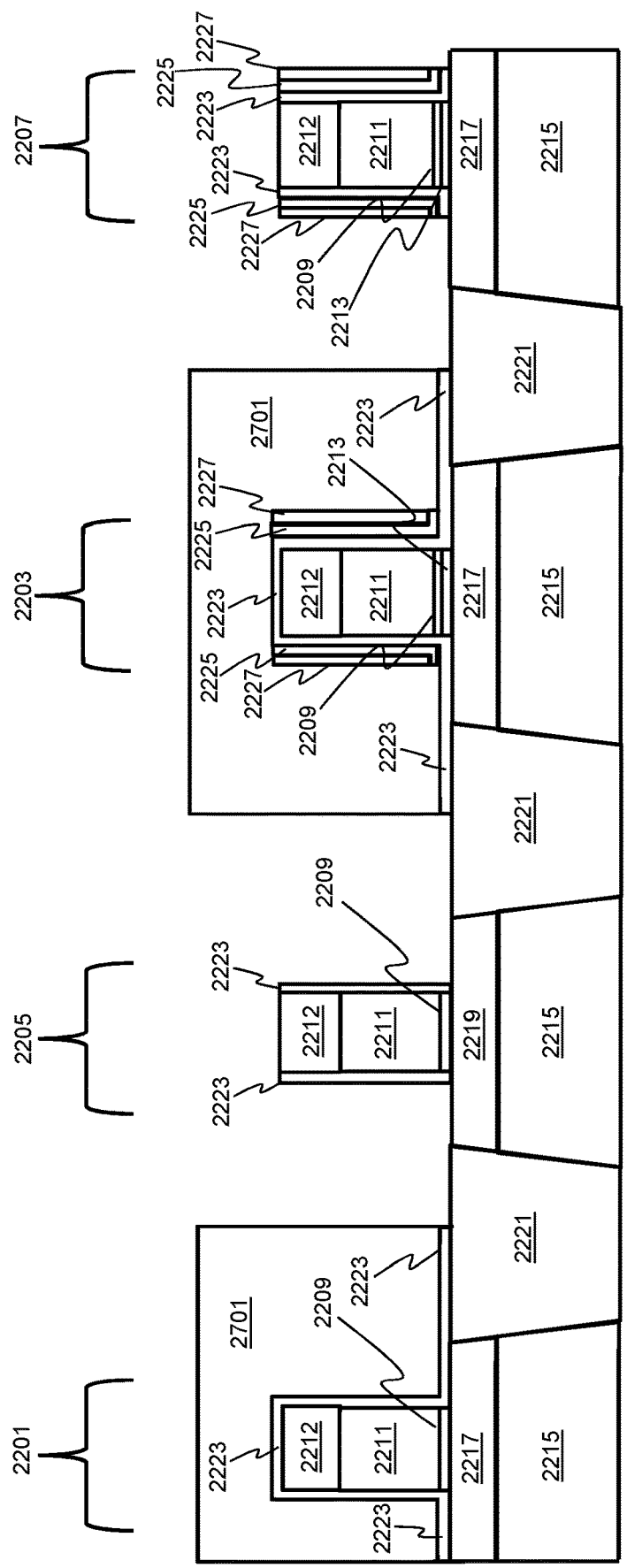

Adverting to FIG. 25, a photoresist layer 2501 is formed over the NFET and PFET EG gate structures 2203 and 2207, respectively. The vertical portions of the nitride layer 2227 are then removed from the NFET and PFET SG gate structures 2201 and 2205, respectively, for example by an isotropic nitride etch highly selective to oxide, e.g., $CH_2F_2$ or $CH_3F$. Next, the photoresist layer 2501 is stripped, and the exposed the oxide liner 2225 is removed, e.g., by wet or dry etching, leaving the oxide liner 2225 only remaining between the nitride layers 2223 and 2227 of the NFET and PFET EG gate structures 2203 and 2207, respectively, as depicted in FIG. 26.

FIGS. 27 through 31 generally follow the same process flow as FIGS. 16 through 21; however, the resulting device requires one fewer mask, and also includes a small L-shaped oxide liner 2225 in the NFET and PFET EG gate structures 2203 and 2207, respectively. Adverting to FIG. 27, a photoresist layer 2701 is formed over the NFET SG and EG gate structures 2201 and 2203, respectively. Alternatively, the photoresist layer 2701 could be formed over the PFET SG and EG gate structures 2205 and 2207, respectively. Whether to mask the NFET or PFET gate structures first depends on the desired spacer thickness for each device, as later stage masking produces thicker spacers. Horizontal portions of the nitride layer 2223 are then removed, e.g., by RIE, from the PFET SG and EG structures 2205 and 2207, respectively. Thereafter, the photoresist layer 2701 is stripped and an epi pre-clean process is performed, e.g., using DHF/SiCoNi™, which will remove some of the BOX layer 2215 (not shown for illustrative convenience).

Figure 28:
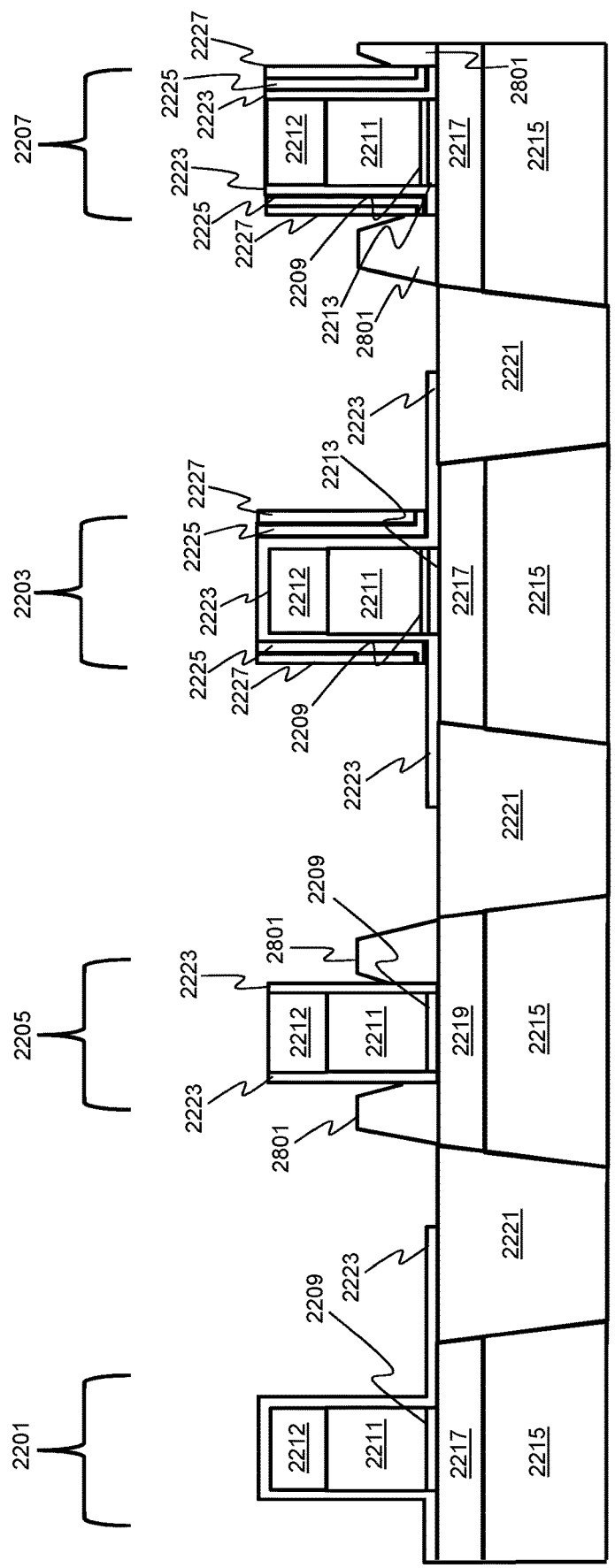
Figure 29:
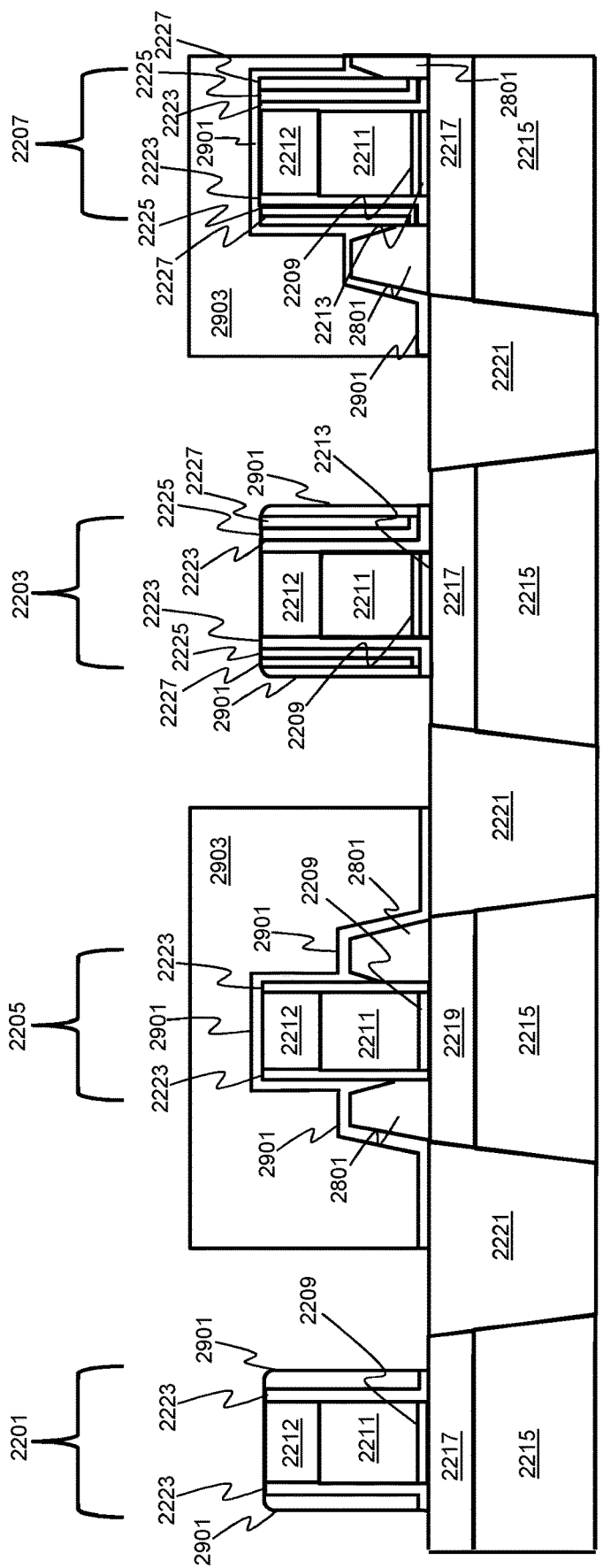

Next, the RSD structures 2801 are formed by epitaxial growth on the SiGe layer 2219 and the Si layer 2217 adjacent to the PFET SG and EG structures 2205 and 2207, respectively, or on the Si layers 2217 adjacent to the NFET SG and EG structures 2201 and 2203, respectively, depending on which gate structures are masked first, as depicted in FIG. 28. Adverting to FIG. 29, a nitride layer 2901 is conformally formed over the entire substrate (not shown for illustrative convenience). A photoresist layer 2903 is then formed over the PFET SG and EG gate structures 2205 and 2207, respectively, or over the NFET SG and EG gate structures 2201 and 2203, respectively, depending on which gate structures are masked first in FIG. 27. Exposed horizontal portions of the nitride layers 2901 and 2223 are then removed, e.g., by RIE.

Figure 30:
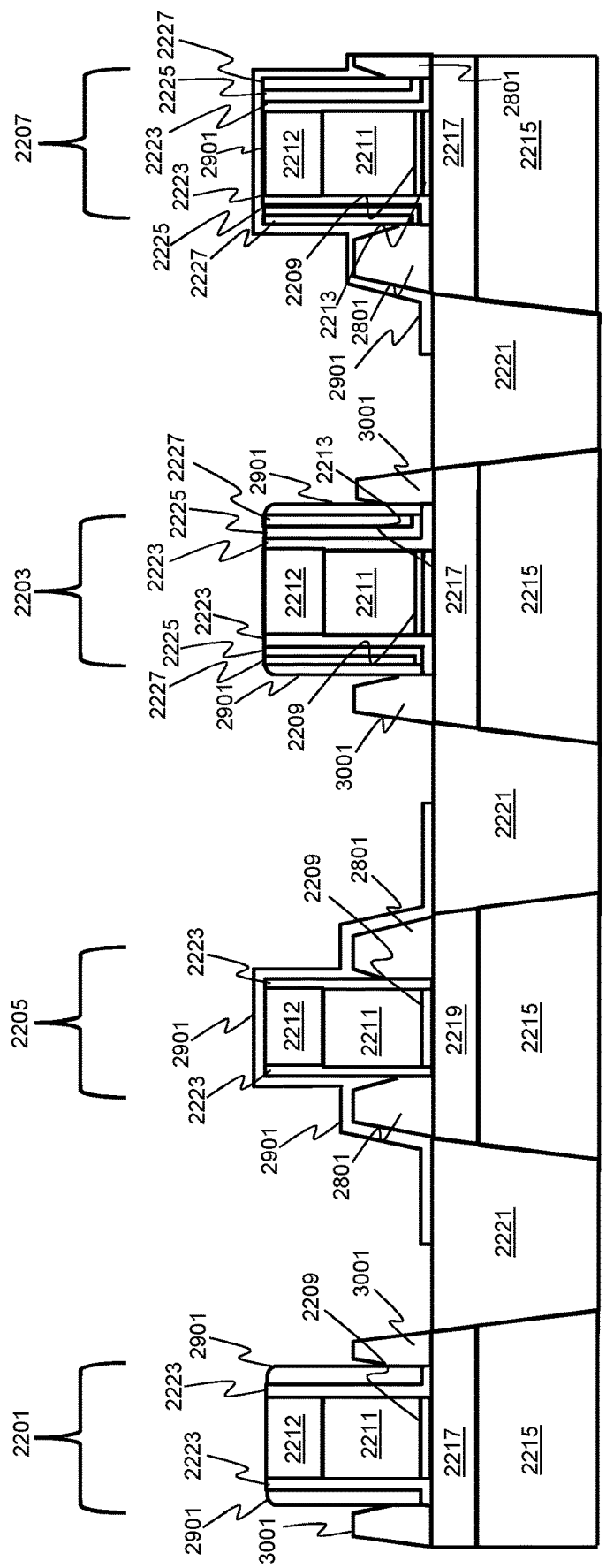

Adverting to FIG. 30, the photoresist layer 2903 is stripped and an epi pre-clean process is again performed, e.g., using DHF/SiCoNi™, removing some of the BOX layer 2215 (not shown for illustrative convenience). The RSD structures 3001 are then formed by epitaxial growth on the Si layers 2217 adjacent to the NFET SG and EG structures 2201 and 2203, respectively, or the SiGe layer 2219 and the Si layer 2217 adjacent to the PFET SG and EG structures 2205 and 2207, respectively, depending on which gate structures are masked first in FIG. 27.

Figure 31:
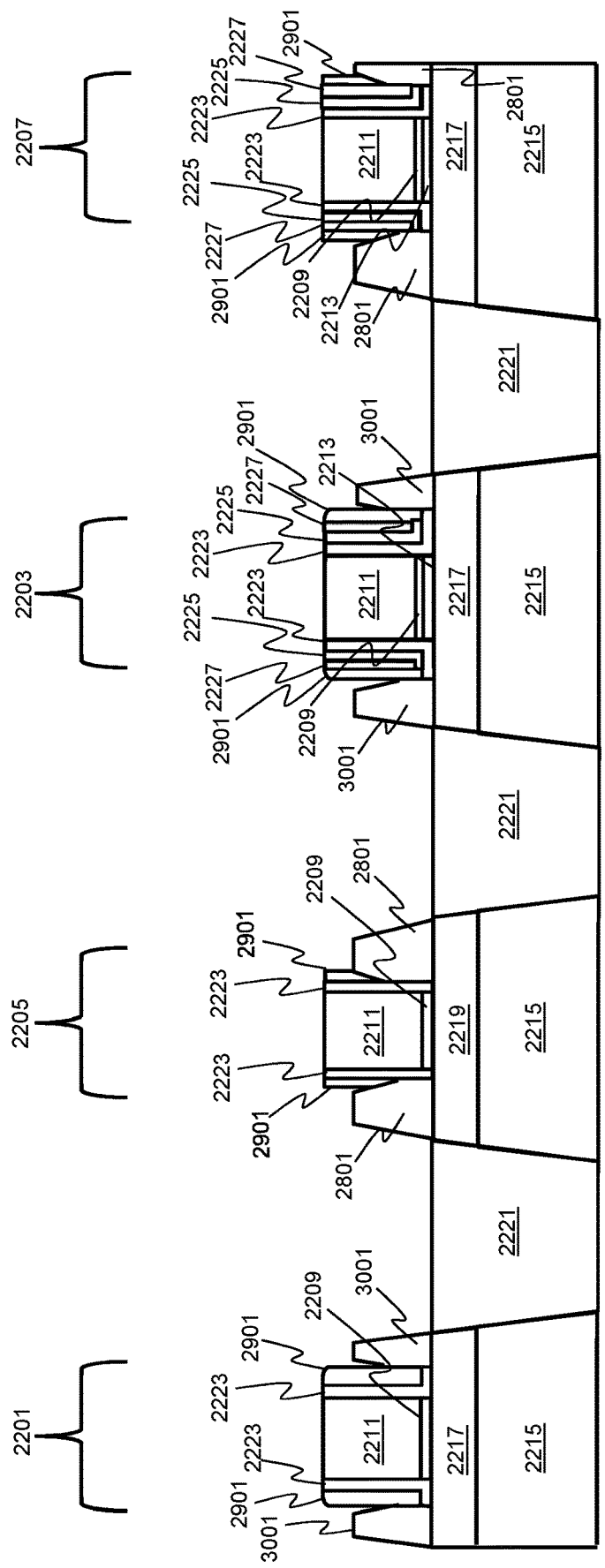

Next, the gate caps 2212 are removed, and the nitride layers 2223, 2227, and 2901 and the oxide liner 2225 are etched, e.g., by RIE or by an appropriate wet etch using hot phosphoric acid, down to the upper surface of the silicon layer 2211, as depicted in FIG. 31. The nitride layer 2901 is then removed from the RSD structures 2801 or 3001, wherever it remains. The removal of the nitride layers 2223, 2227, and 2901 and the oxide liner 2225 may also be performed with an optional OPL plus etch back protection. Thereafter, a spacer nitride deposition, etch, and silicidation is performed (not shown for illustrative convenience).

The embodiments of the present disclosure can achieve several technical effects including requiring only one additional mask layer (re-using the existing EG mask); forming NFET and PFET EG spacers that are thicker to improve reliability without sacrificing SG performance; forming matched PFET and NFET spacers; and forming SG devices that have faceted RSD due to L-shaped spacers, reducing Gate-to-RSD capacitance and improving parasitic capacitance (Ceff), which directly translates to improved AC performance. The embodiments of the present disclosure can also achieve several additional technical effects including forming different and independent spacer thicknesses for SG NFET, SG PFET, and PFET/NFET EG gate structures on FDSOI and all of the gate structures having full nitride spacers. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in FDSOI devices and/or any technology requiring RSD epitaxy.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
a fully depleted silicon on insulator (FDSOI) substrate;
p-type field effect transistor (PFET) core device (SG) and I/O device (EG) gate structures and n-type field effect transistor (NFET) SG and EG gate structures formed on the FDSOI substrate, the SG and EG structures laterally separated;
a dual nitride layer spacer formed on each sidewall of the NFET and PFET SG gate structures;
a triple nitride layer spacer formed on each sidewall of the NFET and PFET EG gate structures; and
raised source/drain (RSD) structures formed on opposite sides of the NFET and PFET SG and EG gate structures,
wherein the NFET SG and PFET SG are positioned adjacent to one another on a first side of the FDSOI substrate, and the NFET EG and PFET EG are positioned adjacent to one another on a second side of the FDSOI substrate, when viewed in cross-section.

2. The device according to claim 1, wherein the dual nitride layer spacer is thinner than the triple nitride layer spacer.

3. The device according to claim 1, wherein the PFET SG gate structure is formed over a layer of silicon germanium (SiGe).

4. The device according to claim 3, wherein the PFET EG and NFET SG and EG structures are formed over a layer of silicon.

5. The device according to claim 1, wherein a layer of oxide is formed between a first and a second layer of nitride of the NFET and PFET EG structures.

6. A device comprising:
p-type field effect transistor (PFET) core device (SG) and I/O device (EG) gate structures and n-type field effect transistor (NFET) SG and EG gate structures, the SG and EG structures laterally separated on a substrate;
a dual nitride layer spacer formed on each sidewall of the NFET and PFET SG gate structures;
a triple nitride layer spacer formed on each sidewall of the NFET and PFET EG gate structures; and
source/drain (SD) structures formed on opposite sides of the NFET and PFET SG and EG gate structures,
wherein the NFET SG and PFET SG are positioned adjacent to one another on a first side of the substrate, and the NFET EG and PFET EG are positioned adjacent to one another on a second side of the substrate, when viewed in cross-section.

7. The device according to claim 6, wherein the dual nitride layer spacer is thinner than the triple nitride layer spacer.

8. The device according to claim 6, wherein the PFET SG gate structure is formed over a layer of silicon germanium (SiGe).

9. The device according to claim 8, wherein the PFET EG and NFET SG and EG structures are formed over a layer of silicon.

10. The device according to claim 6, wherein a layer of oxide is formed between a first and a second layer of nitride of the NFET and PFET EG structures.

11. A device comprising:
p-type field effect transistor (PFET) core device (SG) and I/O device (EG) gate structures and n-type field effect transistor (NFET) SG and EG gate structures formed on a substrate, the SG and EG structures laterally separated;
a first nitride layer spacer formed on each sidewall of the NFET and PFET SG gate structures;
a second nitride layer spacer formed on each sidewall of the NFET and PFET EG gate structures; and
source/drain (SD) structures formed on opposite sides of the NFET and PFET SG and EG gate structures,
wherein the NFET SG and PFET SG are positioned adjacent to one another on a first side of the substrate, and the NFET EG and PFET EG are positioned adjacent to one another on a second side of the substrate, when viewed in cross-section.

12. The device according to claim 11, wherein the first nitride layer spacer is thinner than the second nitride layer spacer.

13. The device according to claim 11, wherein the PFET SG gate structure is formed over a layer of silicon germanium (SiGe).

14. The device according to claim 13, wherein the PFET EG and NFET SG and EG structures are formed over a layer of silicon.

15. The device according to claim 11, wherein a layer of oxide is formed between a first and a second layer of nitride of the NFET and PFET EG structures.

16. The device according to claim 11, wherein the SD structures are raised SD regions (RSD).

17. The device according to claim 11, wherein the substrate comprises a fully depleted silicon on insulator (FD-SOI) substrate.

18. The device according to claim 11, further comprising shallow trench isolation (STI) regions between the NFET and PFET SG and EG gate structures.

19. The device according to claim 11, wherein the first nitride layer spacer comprises a dual nitride layer spacer.

20. The device according to claim 11, wherein the second nitride layer spacer comprises a triple nitride layer spacer.

* * * * *